US012684878B2

(12) United States Patent　　Kagawa et al.

(10) Patent No.: US 12,684,878 B2
(45) Date of Patent: Jul. 14, 2026

(54) SOLID-STATE IMAGING DEVICE AND METHOD FOR MANUFACTURING THE SAME

(71) Applicant: SONY SEMICONDUCTOR SOLUTIONS CORPORATION, Kanagawa (JP)

(72) Inventors: Rena Kagawa, Kanagawa (JP); Shunsuke Maruyama, Kanagawa (JP); Hiroaki Matsuo, Kanagawa (JP); Ryosuke Suenaga, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 546 days.

(21) Appl. No.: 18/004,682

(22) PCT Filed: Jul. 5, 2021

(86) PCT No.: PCT/JP2021/025234
§ 371 (c)(1),
(2) Date: Jan. 9, 2023

(87) PCT Pub. No.: WO2022/014383
PCT Pub. Date: Jan. 20, 2022

(65) Prior Publication Data
US 2023/0253419 A1　　Aug. 10, 2023

(30) Foreign Application Priority Data
Jul. 15, 2020　　(JP) ................................. 2020-121601

(51) Int. Cl.
*H10F 39/00*　　(2025.01)

(52) U.S. Cl.
CPC ......... *H10F 39/802* (2025.01); *H10F 39/014* (2025.01); *H10F 39/026* (2025.01); *H10F 39/8037* (2025.01); *H10F 39/811* (2025.01)

(58) Field of Classification Search
CPC .... H10F 39/802; H10F 39/014; H10F 39/026; H10F 39/8037; H10F 39/811;
(Continued)

(56) References Cited

U.S. PATENT DOCUMENTS

| | | | | |
|---|---|---|---|---|
| 2008/0038865 A1* | 2/2008 | Kwon | ................... | H10F 39/014 |
| | | | | 257/E31.038 |
| 2020/0027910 A1* | 1/2020 | Okura | ................... | H10F 39/802 |
| 2020/0119069 A1* | 4/2020 | Sato | ...................... | H10F 39/807 |

FOREIGN PATENT DOCUMENTS

| | | |
|---|---|---|
| JP | 2009-099867 A | 5/2009 |
| JP | 2016-063156 A | 4/2016 |

(Continued)

OTHER PUBLICATIONS

International Search Report and Written Opinion of PCT Application No. PCT/JP2021/025234, issued on Sep. 21, 2021, 11 pages of ISRWO.

*Primary Examiner* — Fernando L Toledo
*Assistant Examiner* — Jorge Andres Lopez
(74) *Attorney, Agent, or Firm* — CHIP LAW GROUP

(57) ABSTRACT

Provided is a solid-state imaging device including a first substrate that performs photoelectric conversion and a second substrate that reads photoelectric-converted photocurrent, the first substrate and the second substrate being stacked. The first substrate includes a photoelectric conversion part, a first insulating film that is disposed closer to the second substrate than the photoelectric conversion part and accumulates and transfers charge photoelectric-converted by the photoelectric conversion part, a first electrode disposed closer to the second substrate than the first insulating film (Continued)

and disposed facing the photoelectric conversion part, a second electrode disposed closer to the second substrate than the first insulating film and disposed apart from the first electrode, and an impurity ion diffusion region disposed facing the second electrode and disposed in a depth direction of the photoelectric conversion part from an interface between the photoelectric conversion part and the first insulating film.

17 Claims, 26 Drawing Sheets

(58) Field of Classification Search
CPC .... H10F 39/18; H10F 39/1825; H10F 39/199; H10F 39/8057; H10F 39/12; H10F 39/8033; H10F 39/807; H10F 39/809; H10F 39/812; H04N 25/70
See application file for complete search history.

(56) References Cited

FOREIGN PATENT DOCUMENTS

| | | | |
|---|---|---|---|
| JP | 2017-103428 A | 6/2017 | |
| JP | 2017-143158 A | 8/2017 | |
| JP | 2017-157816 A | 9/2017 | |
| WO | 2013/021577 A1 | 2/2013 | |
| WO | 2019/235179 A1 | 12/2019 | |
| WO | 2020/017330 A1 | 1/2020 | |
| WO | 2020/027117 A1 | 2/2020 | |

* cited by examiner

SOLID-STATE IMAGING DEVICE AND METHOD FOR MANUFACTURING THE SAME

CROSS REFERENCE TO RELATED APPLICATIONS

This application is a U.S. National Phase of International Patent Application No. PCT/JP2021/025234 filed on Jul. 5, 2021, which claims priority benefit of Japanese Patent Application No. JP 2020-121601 filed in the Japan Patent Office on Jul. 15, 2020. Each of the above-referenced applications is hereby incorporated herein by reference in its entirety.

TECHNICAL FIELD

The present disclosure relates to a solid-state imaging device and a method for manufacturing the same.

BACKGROUND ART

In a solid-state imaging device having a structure in which a substrate on which a photoelectric conversion film, such as an organic sensor or an InGaAs sensor, is formed and a substrate on which a readout circuit is formed are stacked, since the photoelectric conversion film cannot be completely depleted, there is a problem that the photoelectrically converted charge cannot be completely transferred and kTC noise cannot be removed.

As a measure against this problem, in Patent Document 1, an insulating film and a storage electrode are arranged below a photoelectric conversion layer, and a potential of the storage electrode is controlled, so that a charge photoelectrically converted in the photoelectric conversion layer is accumulated in the insulating film and then transferred to a lower electrode.

CITATION LIST

Patent Document

Patent Document 1: Japanese Patent Application Laid-Open No. 2017-157816

SUMMARY OF THE INVENTION

Problems to be Solved by the Invention

However, in the element structure of Patent Document 1, there is a problem that some charges flow into the lower electrode while the charges photoelectrically converted in the photoelectric conversion layer are accumulated in the insulating film.

Therefore, the present disclosure provides a fixed imaging device in which some charges do not flow into an electrode during accumulation of photoelectrically converted charges, and a method for manufacturing the solid-state imaging device.

Solutions to Problems

In order to solve the above problem, according to the present disclosure, there is provided a solid-state imaging device including a first substrate that performs photoelectric conversion and a second substrate that reads photoelectric-converted photocurrent, the first substrate and the second substrate being stacked, in which the first substrate includes:

a photoelectric conversion part;

a first insulating film that is disposed closer to the second substrate than the photoelectric conversion part and accumulates and transfers charge photoelectric-converted by the photoelectric conversion part;

a first electrode disposed closer to the second substrate than the first insulating film and disposed facing the photoelectric conversion part;

a second electrode disposed closer to the second substrate than the first insulating film and disposed apart from the first electrode; and an impurity ion diffusion region disposed facing the second electrode and disposed in a depth direction of the photoelectric conversion part from an interface between the photoelectric conversion part and the first insulating film.

The impurity ion diffusion region may be disposed in the photoelectric conversion part facing a region including an entire projected area obtained by projecting the second electrode on a surface of the photoelectric conversion part.

A semiconductor layer disposed between the impurity ion diffusion region and the first insulating film and having a wider band gap than the impurity ion diffusion region may be provided.

The first substrate further may include:

a plurality of pixels each including the photoelectric conversion part; and a third electrode disposed closer to the second substrate than the first insulating film and along a boundary between the pixels, the third electrode being set to a fixed potential, and at least a part of the impurity ion diffusion region may be arranged in a region facing the third electrode in the photoelectric conversion part.

The impurity ion diffusion region may be disposed in the photoelectric conversion part facing a region including an entire projected area obtained by projecting the third electrode on a surface of the photoelectric conversion part.

The impurity ion diffusion region may include:

a first diffusion region disposed in a region facing the second electrode in the photoelectric conversion part; and a second diffusion region disposed in a region facing the third electrode in the photoelectric conversion part, and the first diffusion region and the second diffusion region may be arranged to be in contact with each other.

The impurity ion diffusion region may include:

a first diffusion region disposed in a region facing the second electrode in the photoelectric conversion part; and a second diffusion region disposed in a region facing the third electrode in the photoelectric conversion part, and the first diffusion region and the second diffusion region may be arranged apart from each other.

The first substrate may have a contact electrically connected to the impurity ion diffusion region for each of the pixels, and the impurity ion diffusion region may be set to a predetermined potential by a voltage applied to the contact.

A contact disposed outside an effective pixel region in which the photoelectric conversion part is disposed and electrically connected to the impurity ion diffusion region may be provided, and the impurity ion diffusion region may be set to a predetermined potential by a voltage applied to the contact.

The impurity ion diffusion region may be a region in which impurity ions having a polarity opposite to a polarity of a charge accumulated and transferred by the first insulating film are diffused.

A second insulating film provided between the first insulating film and the first electrode and containing a material different from a material of the first insulating film may be provided.

A columnar body disposed in a depth direction of the photoelectric conversion part from the interface between the photoelectric conversion part and the first insulating film may be provided, and the impurity ion diffusion region may be disposed along a surface of the columnar body.

The first substrate may further include a fourth electrode disposed on a side opposite to the first electrode with the photoelectric conversion part interposed between the first electrode and the fourth electrode, and the impurity ion diffusion region may be disposed in contact with the fourth electrode.

The impurity ion diffusion region may have a first diffusion region and a second diffusion region that are different in depth from the interface between the photoelectric conversion part and the first insulating film, and are arranged adjacent to each other.

The first diffusion region may be in contact with a surface of the photoelectric conversion part on a side opposite to the interface, and the second diffusion region may be disposed up to a depth position shallower than a surface on the opposite side of the photoelectric conversion part.

The impurity ion diffusion region may be diffused from the interface between the photoelectric conversion part and the first insulating film in a curved surface shape in a depth direction of the photoelectric conversion part.

The first insulating film may be set to different potentials in a case of accumulating the photoelectric-converted charge from the photoelectric conversion part and in a case of transferring the accumulated charge to the second electrode.

The photoelectric conversion part may be an organic photoelectric conversion part containing a plurality of types of organic materials having different polarities, the first substrate may further include:

an inorganic photoelectric conversion part that is disposed on a side opposite to the photoelectric conversion part with the first electrode and the second electrode interposed between the photoelectric conversion part and the inorganic photoelectric conversion part and contains a plurality of inorganic materials having different polarities, the inorganic photoelectric conversion part may photoelectric-convert light in a plurality of optical wavelength ranges separately, and an optical wavelength range photoelectric-converted by the organic photoelectric conversion part may be different from an optical wavelength range photoelectric-converted by the inorganic photoelectric conversion part.

According to another aspect of the present disclosure, there is provided a method for manufacturing a solid-state imaging device, the method including the steps of:

forming an impurity ion diffusion region by implanting and diffusing impurity ions into a photoelectric conversion part in a first substrate;

forming a first insulating film on the first substrate so as to be in contact with the photoelectric conversion part and the impurity ion diffusion region;

forming a first electrode on the first insulating film so as to face the photoelectric conversion part, and forming a second electrode so as to correspond to the impurity ion diffusion region;

forming a wiring layer connected to the first electrode and the second electrode;

connecting a wiring layer of a second substrate to the wiring layer of the first substrate;

thinning the first substrate by cutting a surface side of the first substrate opposite to the wiring layer; and forming a third electrode on a cut surface of the first substrate.

The method for manufacturing the solid-state imaging device, in which the step of forming the impurity ion diffusion region includes forming a trench in a depth direction from a surface of the photoelectric conversion part, and implanting impurity ions into the formed trench to form the impurity ion diffusion region.

BRIEF DESCRIPTION OF DRAWINGS

FIG. 6 is a diagram illustrating a layout for four pixels.

MODE FOR CARRYING OUT THE INVENTION

Hereinafter, embodiments of a solid-state imaging device and a method for manufacturing the same will be described with reference to the drawings. In the following, the main components of the solid-state imaging device and the method for manufacturing the same will be mainly described, but the solid-state imaging device and the method for manufacturing the same may have components and functions that are not illustrated or described. The following description does not exclude components and functions that are not illustrated or described.

First Embodiment

Figure 1:
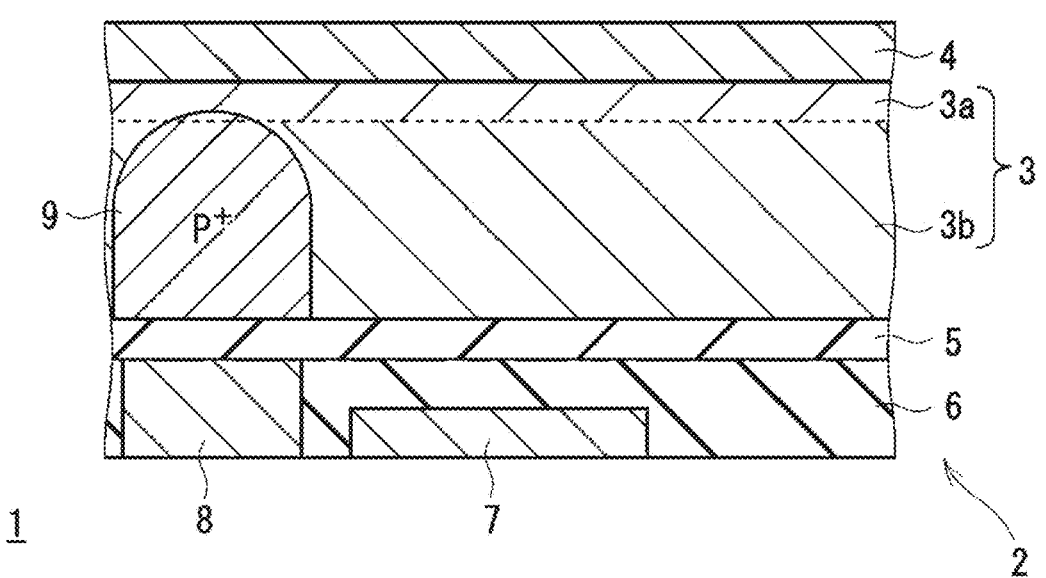
FIG. 1 is a cross-sectional view of a solid-state imaging device according to a first embodiment of the present disclosure.

FIG. 1 is a cross-sectional view of a solid-state imaging device 1 according to a first embodiment of the present disclosure. The solid-state imaging device 1 in FIG. 1 includes a first substrate 2, and a photoelectric conversion part 3 is provided on the first substrate 2. An upper electrode 4 is disposed on one surface of the photoelectric conversion part 3. A first insulating film 5 is disposed on the opposite surface of the photoelectric conversion part 3. A second insulating film 6 is disposed on the first insulating film 5. In the second insulating film 6, a storage electrode 7 and a lower electrode 8 are arranged apart from each other.

The photoelectric conversion part 3 has a P+ layer 3a on the upper electrode 4 side, and has an N layer or a non-doped layer (also referred to as an i layer) 3b on the lower electrode 8 side. The material of the photoelectric conversion part 3 is, for example, silicon (Si), germanium (Ge), or SiGe. Alternatively, the material of the photoelectric conversion part 3 may be a compound semiconductor such as InGaAs or InAs, an organic semiconductor, or the like.

The first insulating film 5 is preferably a material having a potential capable of accumulating and transferring the charge photoelectric-converted by the photoelectric conversion part 3. For example, in a case where the photoelectric conversion part 3 is InGaAs, the material of the first insulating film 5 is IGZO, ZnO, SnO2, TiO2, Zn2SnO4, or the like. In addition, in a case where the first insulating film 5 accumulates and transfers holes, the material of the first insulating film 5 is NiO, MoOx, or the like.

The second insulating film 6 includes a material different from that of the first insulating film 5. More specifically, the material of the second insulating film 6 is, for example, SiO2, alumina, HfO2, or the like.

The upper electrode 4 is a transparent electrode such as indium tin oxide (ITO). The transparent electrode means an electrode that transmits light in an optical wavelength range photoelectric-converted by the photoelectric conversion part 3. The storage electrode 7 and the lower electrode 8 may include the same material as the upper electrode 4 or may include different materials.

The photoelectric conversion part 3 has an impurity ion diffusion region 9. The impurity ion diffusion region 9 is provided in the depth direction of the photoelectric conversion part 3 (the direction of the upper electrode 4) from the interface between the photoelectric conversion part 3 and the first insulating film 5. The impurity ion diffusion region 9 is disposed so as to cover the lower electrode 8. More specifically, the impurity ion diffusion region 9 is disposed in the photoelectric conversion part 3 so as to face a region including the entire projected area obtained by projecting the lower electrode 8 on the surface of the photoelectric conversion part 3. The impurity ion diffusion region 9 is a region formed by implanting impurity ions from the surface of the photoelectric conversion part 3, that is, the interface between the photoelectric conversion part 3 and the first insulating film 5 and diffusing the impurity ions in the photoelectric conversion part 3. Since the impurity ion diffusion region 9 is formed by diffusion, the boundary surface of the impurity ion diffusion region 9 in the photoelectric conversion part 3 has a curved surface shape.

The impurity ion diffusion region 9 contains impurity ions having a polarity opposite to that of charges accumulated in the first insulating film 5. Since the impurity ion diffusion region 9 recombines the charges photoelectric-converted by the photoelectric conversion part 3, the charges photoelectric-converted by the photoelectric conversion part 3 do not flow into the lower electrode 8 while the first insulating film 5 accumulates the charges photoelectric-converted by the photoelectric conversion part 3. As a result, noise of the solid-state imaging device 1 can be suppressed.

Figure 2A:
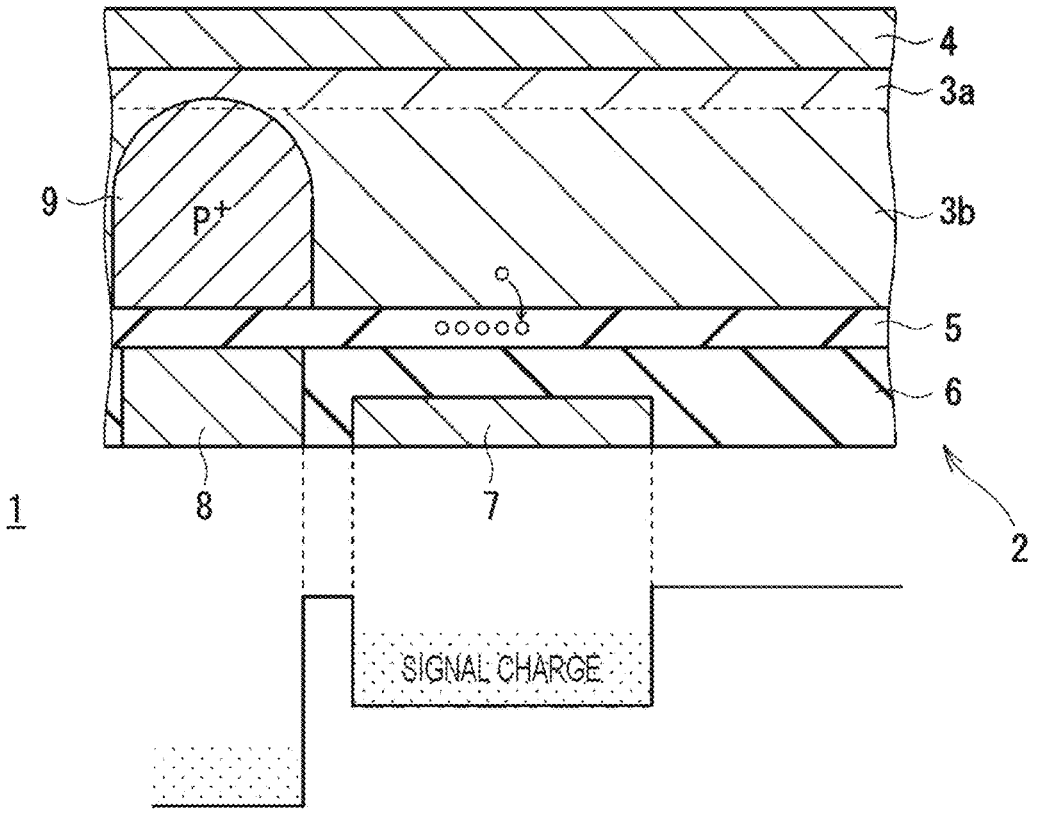
FIG. 2A is a diagram showing potential changes of a storage electrode and a lower electrode at the time of charge storage.
Figure 2B:
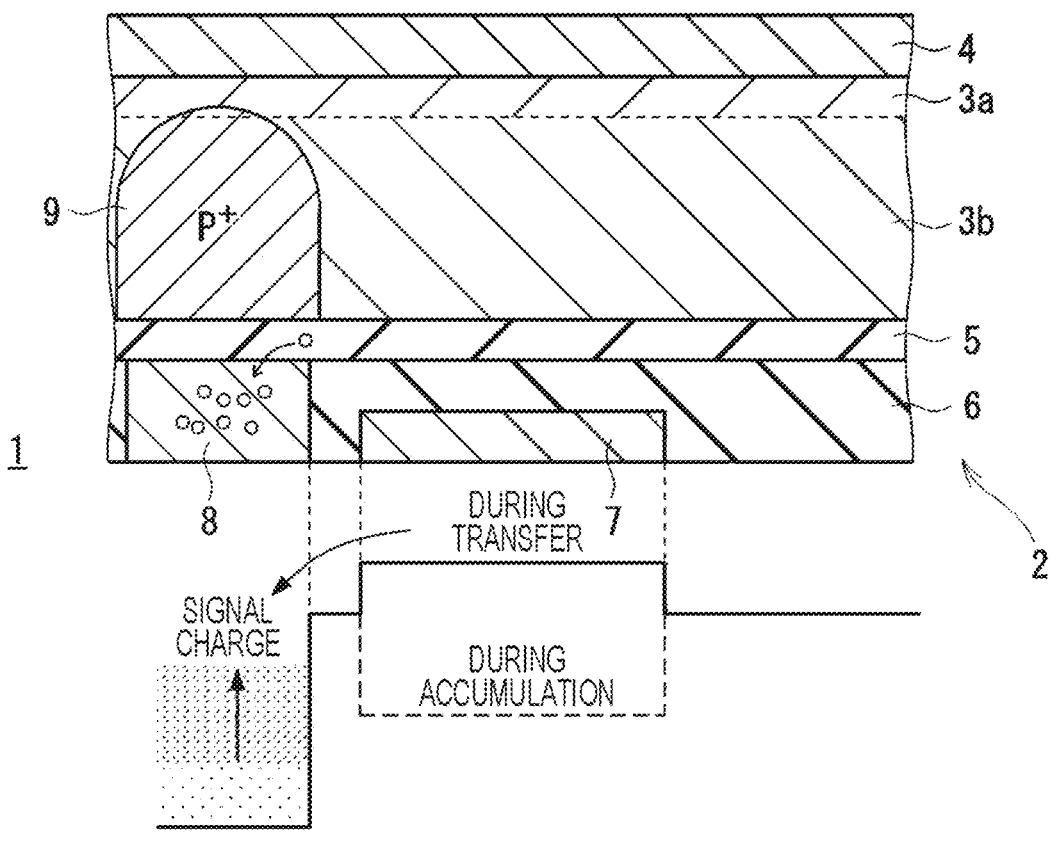
FIG. 2B is a diagram showing potential changes of the storage electrode and the lower electrode at the time of charge transfer.

FIGS. 2A and 2B are diagrams illustrating potential changes of the storage electrode 7 and the lower electrode 8. FIGS. 2A and 2B illustrate an example in which the charges accumulated and transferred by the first insulating film 5 are electrons. The electrons photoelectric-converted by the photoelectric conversion part 3 are moved from the photoelectric conversion part 3 to the first insulating film 5 by increasing the potential of the storage electrode 7 as illustrated in FIG. 2A. In this state, potential walls are formed on both sides of the storage electrode 7, so that electrons are accumulated in the first insulating film 5. Thereafter, as illustrated in FIG. 2B, the potential wall between the storage electrode 7 and the lower electrode 8 is lowered by lowering the potential of the storage electrode 7, and electrons are transferred from the storage electrode 7 to the lower electrode 8.

Figure 3:
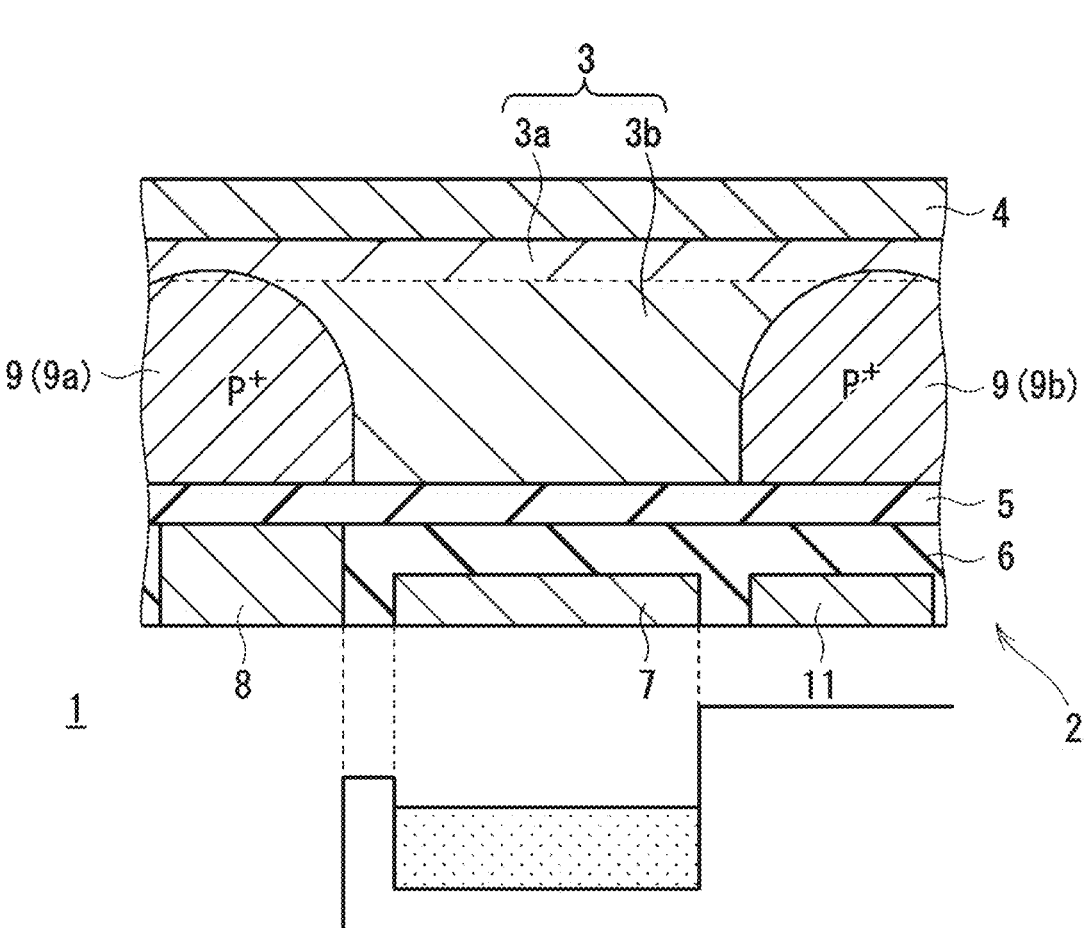
FIG. 3 is a cross-sectional view of a solid-state imaging device according to a modification of the present embodiment.

FIG. 3 is a cross-sectional view of a solid-state imaging device 1 according to a modification of the present embodiment. In the solid-state imaging device 1 of FIG. 3, a shield electrode 11 is added to the structure of FIG. 1, and an impurity ion diffusion region 9 is provided at a position facing the shield electrode 11 in the photoelectric conversion part 3. The shield electrode 11 is provided for separation between pixels. The shield electrode 11 is provided in the second insulating film 6 and is disposed separately from the storage electrode 7 and the lower electrode 8. The shield electrode 11 is set to a fixed potential, and as illustrated in the lower side of FIG. 3, a potential wall is formed between the storage electrode 7 and the shield electrode 11 when electrons are accumulated in the first insulating film 5.

The photoelectric conversion part 3 of FIG. 3 includes an impurity ion diffusion region 9 (hereinafter, also referred to as a first diffusion region 9*a*) disposed at a position facing the lower electrode 8 and an impurity ion diffusion region 9 (hereinafter, also referred to as a second diffusion region 9*b*) disposed at a position facing the shield electrode 11.

The first diffusion region 9*a* is provided in the depth direction of the photoelectric conversion part 3 (the direction of the upper electrode 4) from the interface between the photoelectric conversion part 3 and the first insulating film 5. The second diffusion region 9*b* is provided in the depth direction of the photoelectric conversion part 3 (the direction of the upper electrode 4) from the interface between the photoelectric conversion part 3 and the first insulating film 5. The second diffusion region 9*b* is disposed so as to cover the shield electrode 11. More specifically, the second diffusion region 9*b* is disposed in the photoelectric conversion part 3 facing a region including the entire projected area obtained by projecting the shield electrode 11 on the surface of the photoelectric conversion part 3. Both the first diffusion region 9*a* and the second diffusion region 9*b* are regions into which impurity ions having a polarity opposite to that of the charge accumulated and transferred by the first insulating film 5 are implanted and diffused. The first diffusion region 9*a* and the second diffusion region 9*b* may be in contact with each other and electrically connected. Alternatively, the first diffusion region 9*a* and the second diffusion region 9*b* may be arranged apart from each other so as not to be electrically connected.

By providing the first diffusion region 9*a* and the second diffusion region 9*b*, it is possible to prevent charges from flowing from the photoelectric conversion part 3 into the lower electrode 8 and the shield electrode 11 while the first insulating film 5 accumulates charges.

Figure 4:
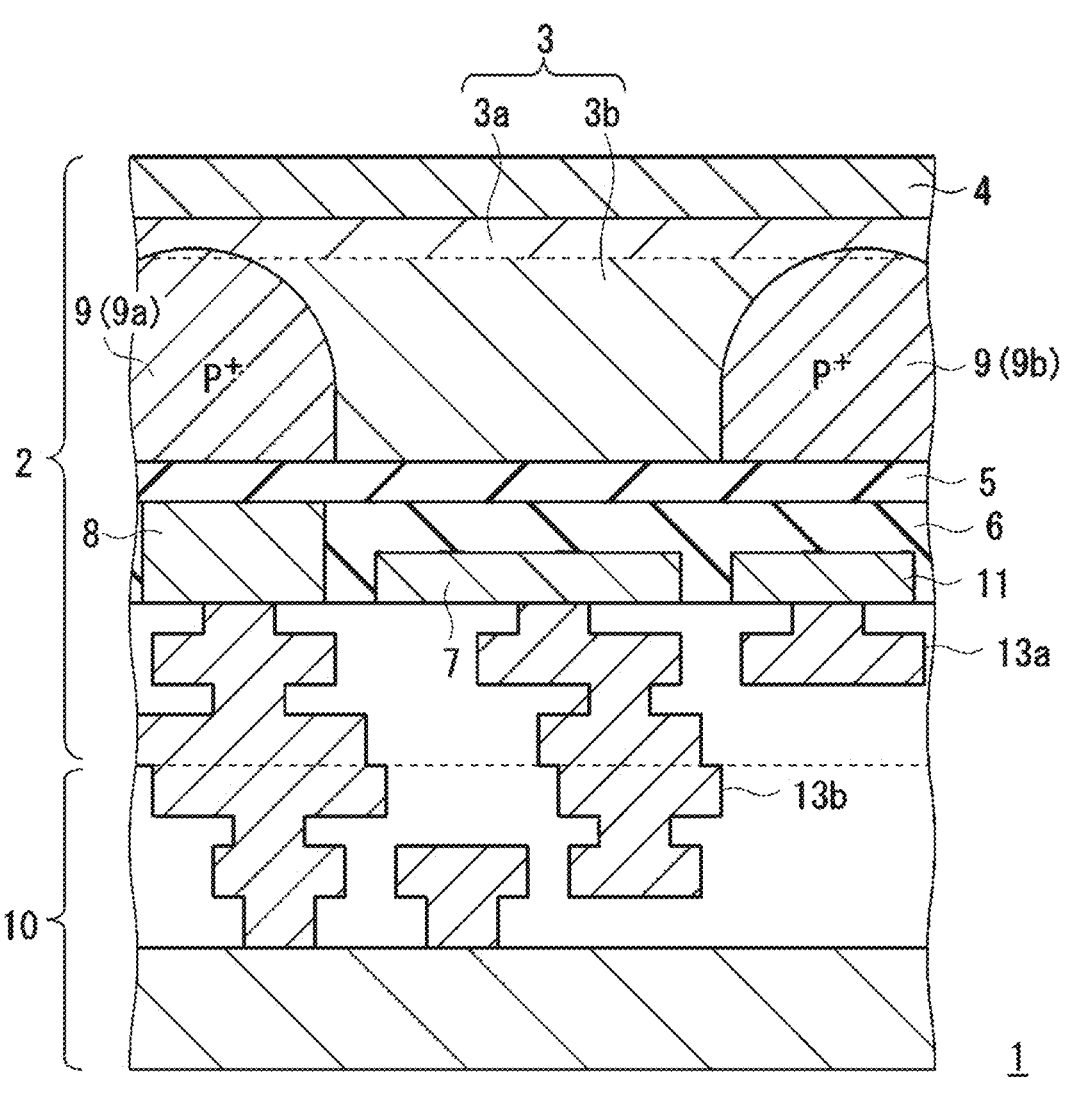
FIG. 4 is a more detailed cross-sectional view of the solid-state imaging device in FIG. 3.

Although not illustrated in FIGS. 1, 2A, 2B, and 3, the solid-state imaging devices 1 and 1*a* according to the present embodiment have a structure in which a first substrate 2 having a photoelectric conversion part 3 and a second substrate that reads out a photoelectric-converted photocurrent are stacked. FIG. 4 is a more detailed cross-sectional view of the solid-state imaging device 1 in FIG. 3. In the solid-state imaging device 1 of FIG. 4, the first substrate 2 and a second substrate 10 are stacked by connecting a wiring layer 13*a* connected to each of the electrodes 7, 8, and 11 of the first substrate 2 and a wiring layer 13*b* of the second substrate 10. Connection between the wiring layers 13*a* and 13*b* is performed by Cu—Cu bonding, bumps, vias, or the like.

Although not illustrated in FIG. 1, the wiring layer 13*b* of the second substrate 10 is also connected to the wiring layer 13*a* on each of the electrodes 7 and 8 in the solid-state imaging device 1 in FIG. 1. Furthermore, also in the solid-state imaging device 1 according to various modifications described below, although not illustrated in the cross-sectional view, the wiring layer 13*b* of the second substrate 10 is actually connected to the wiring layer 13*a* of the first substrate 2, and the first substrate 2 and the second substrate 10 are stacked.

Figure 5:
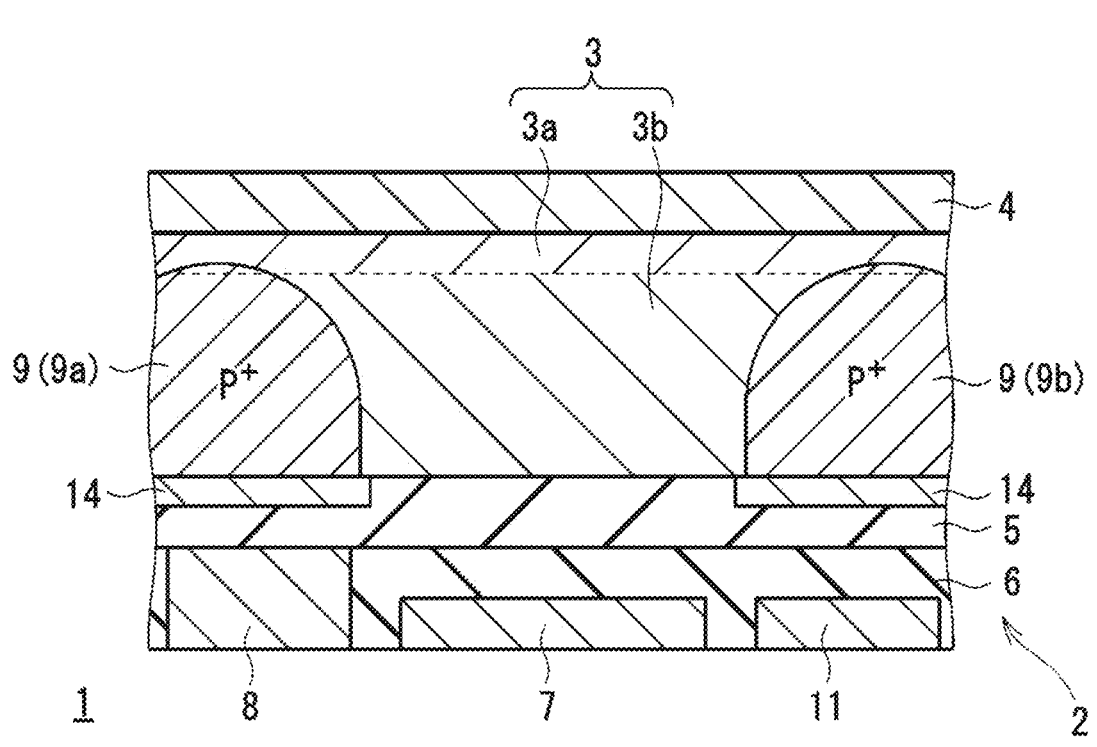
FIG. 5 is a cross-sectional view of a solid-state imaging device according to a second modification.

FIG. 5 is a cross-sectional view of a solid-state imaging device 1 according to a second modification. In the solid-state imaging device 1 of FIG. 5, a semiconductor layer 14 having a wider band gap than the impurity ion diffusion region 9 is disposed between the impurity ion diffusion region 9 and the first insulating film 5. A material of the semiconductor layer 14 is, for example, InP. By providing such a semiconductor layer 14, free electrons generated by crystal defects or the like inside the impurity ion diffusion region 9 or the photoelectric conversion part 3 can be recombined inside the semiconductor layer 14, and dark current can be suppressed. As described later, in a case where an InP substrate is used as the first substrate 2, the cross-sectional structure of FIG. 5 can be relatively easily formed by leaving a part of the InP substrate as the above-described semiconductor layer 14 instead of etching and removing the entire InP substrate after stacking the InP substrate and the second substrate 10.

Note that in FIG. 5, the semiconductor layer 14 is provided between both the first diffusion region 9*a* and the second diffusion region 9*b* constituting the impurity ion diffusion region 9 and the first insulating film 5, but may be provided in only one of them. Furthermore, a semiconductor layer 14 similar to that in FIG. 5 may be provided between the impurity ion diffusion region 9 and the first insulating film 5 in the solid-state imaging device 1 in FIG. 1.

Figure 6:
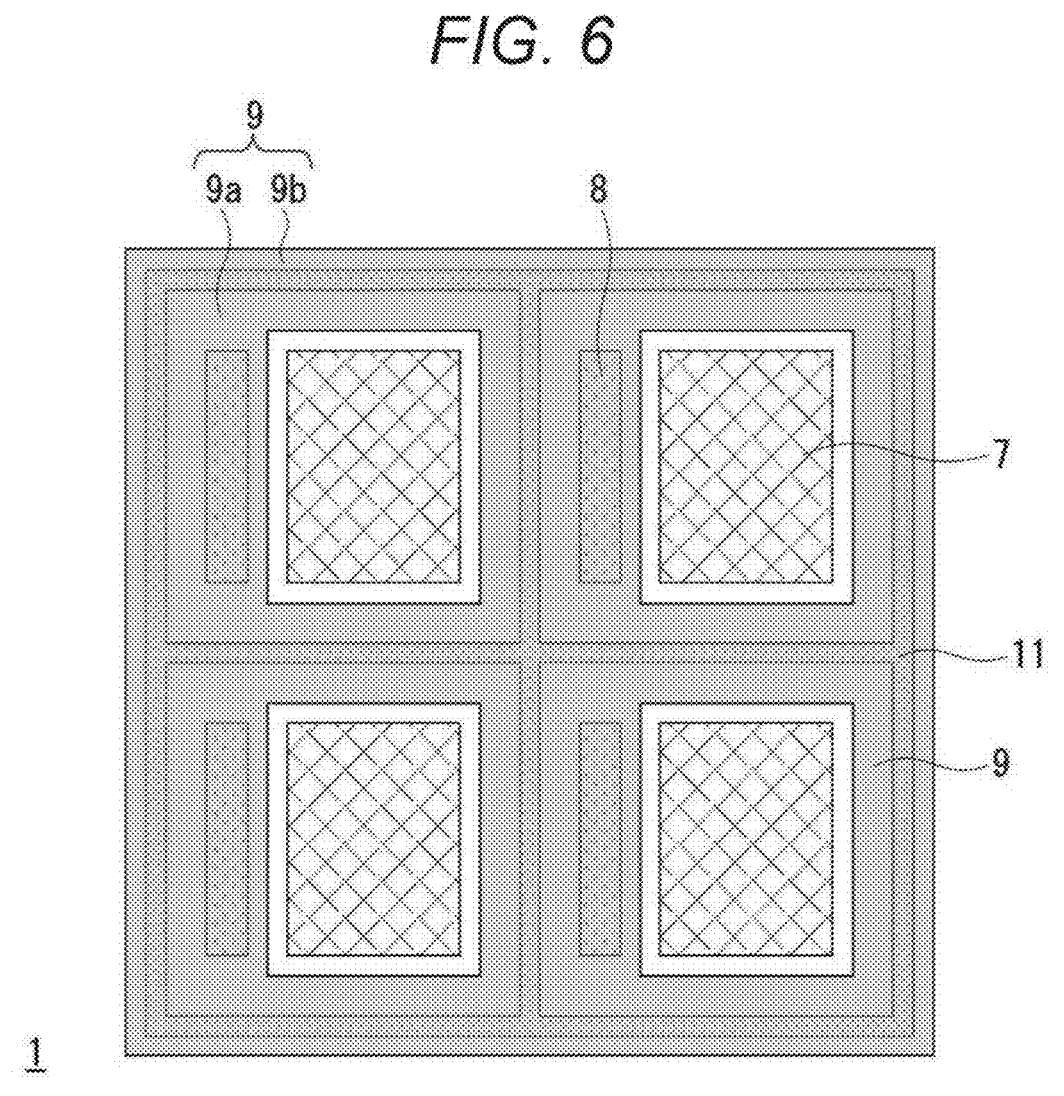

Next, layout arrangement of the solid-state imaging device 1 according to the present embodiment will be described. FIG. 6 is a layout diagram of the solid-state imaging device 1 of FIG. 4. FIG. 6 illustrates a layout for four pixels. As illustrated in FIG. 6, the pixel region of each pixel except for the portion immediately above the storage electrode 7 is covered with the impurity ion diffusion region 9. In the example of FIG. 6, the first diffusion region 9*a* covering the lower electrode 8 and the second diffusion region 9*b* covering the shield electrode 11 are connected, and the first diffusion region 9*a* and the second diffusion region 9*b* have the same potential.

Figure 7:
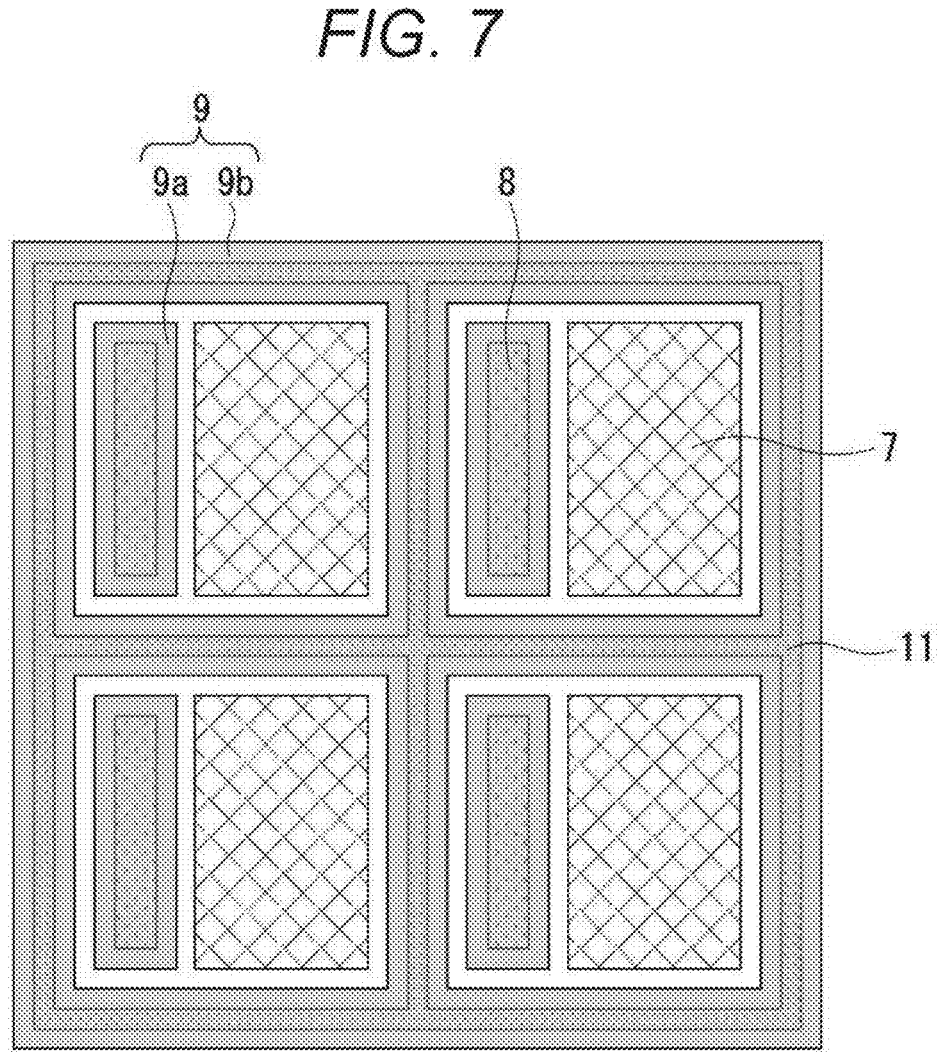
FIG. 7 is a layout diagram according to a first modification of the solid-state imaging device in FIG. 4.

FIG. 7 is a layout diagram according to a first modification of the solid-state imaging device 1 in FIG. 4. In FIG. 7, unlike FIG. 6, the first diffusion region 9*a* covering the lower electrode 8 and the second diffusion region 9*b* covering the shield electrode 11 are arranged apart from each other. In the case of FIG. 7, the first diffusion region 9*a* and the second diffusion region 9*b* can be set to different potentials.

Figure 8:
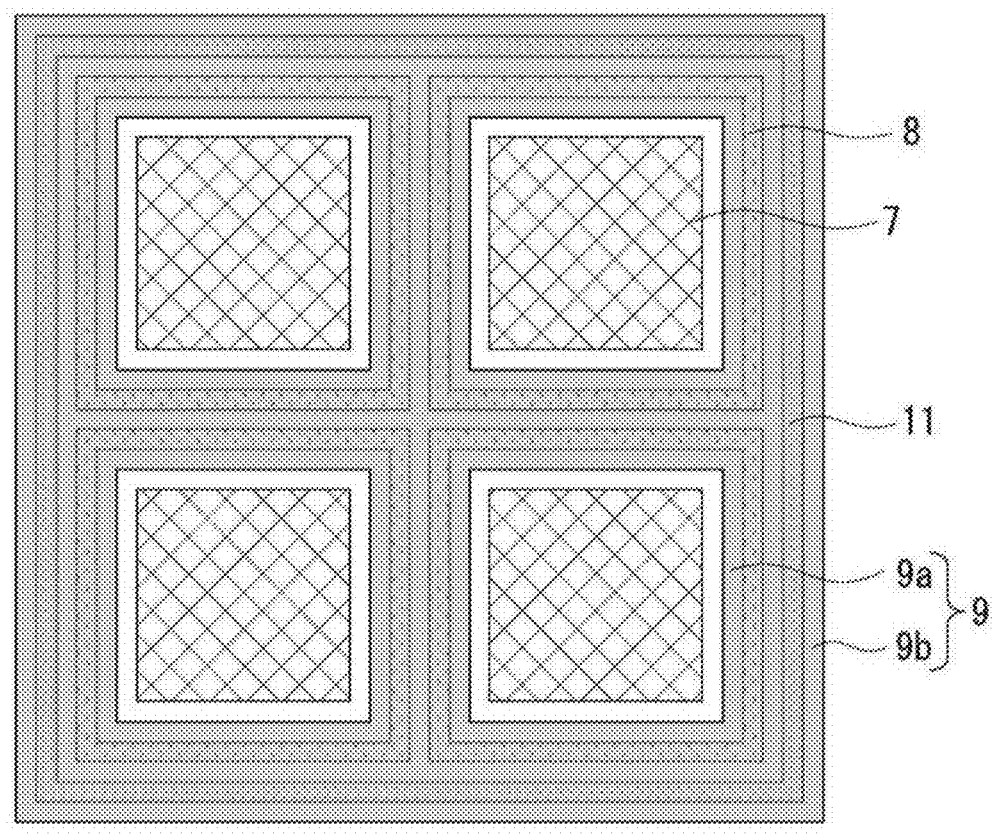
FIG. 8 is a layout diagram according to a second modification of the solid-state imaging device in FIG. 4.

FIG. 8 is a layout diagram according to a second modification of the solid-state imaging device 1 in FIG. 4. In FIG. 8, the lower electrode 8 is disposed so as to surround the storage electrode 7, and the shield electrode 11 is disposed so as to surround the lower electrode 8. The first diffusion region 9*a* covering the lower electrode 8 and the second diffusion region 9*b* covering the shield electrode 11 are connected.

In the case of FIG. 8, the variation in the distance from the storage electrode 7 to the lower electrode 8 can be suppressed, and the charge transfer distance from the storage electrode 7 to the lower electrode 8 can be shortened. Furthermore, also in the case of FIG. 8, it is possible to prevent the charge photoelectric-converted by the photoelectric conversion part 3 from flowing into the lower electrode 8 or the shield electrode 11 while the charge is accumulated in the first insulating film 5.

Figure 9:
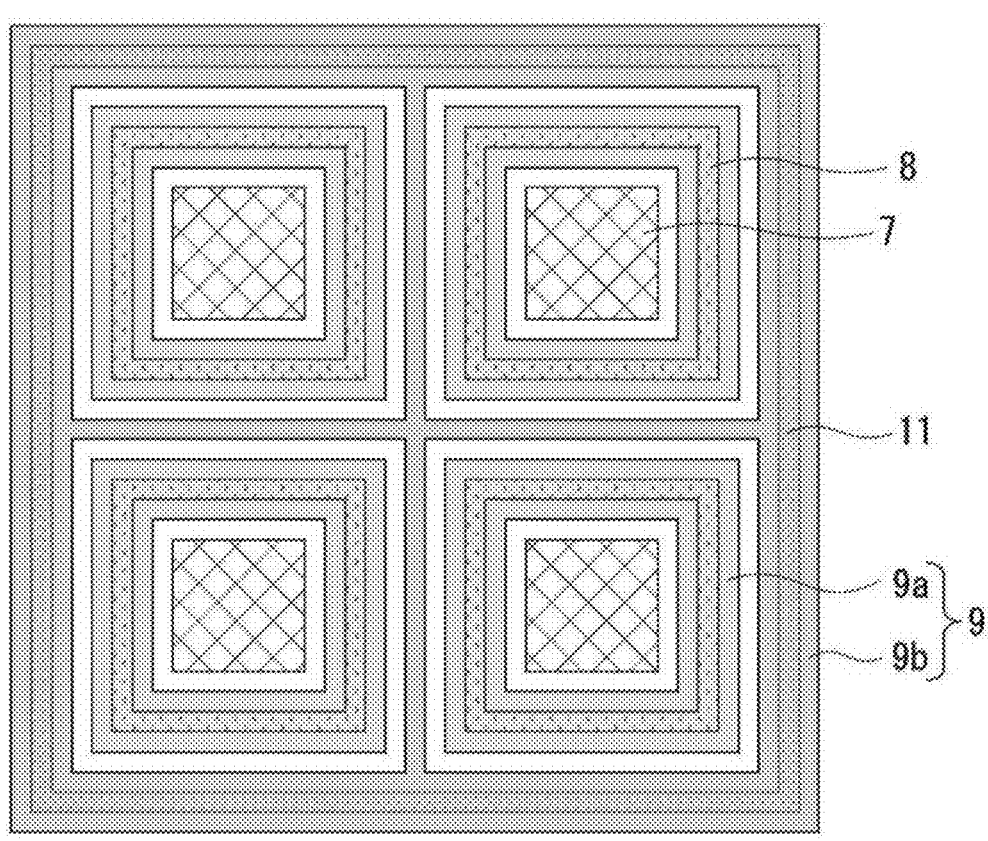
FIG. 9 is a layout diagram according to a third modification of the solid-state imaging device in FIG. 4.

FIG. 9 is a layout diagram according to a third modification of the solid-state imaging device 1 in FIG. 4. In FIG. 9, unlike FIG. 8, the first diffusion region 9*a* covering the lower electrode 8 and the second diffusion region 9*b* covering the shield electrode 11 are arranged separately. Therefore, the first diffusion region 9*a* and the second diffusion region 9*b* can be set to different potentials.

Figure 10:
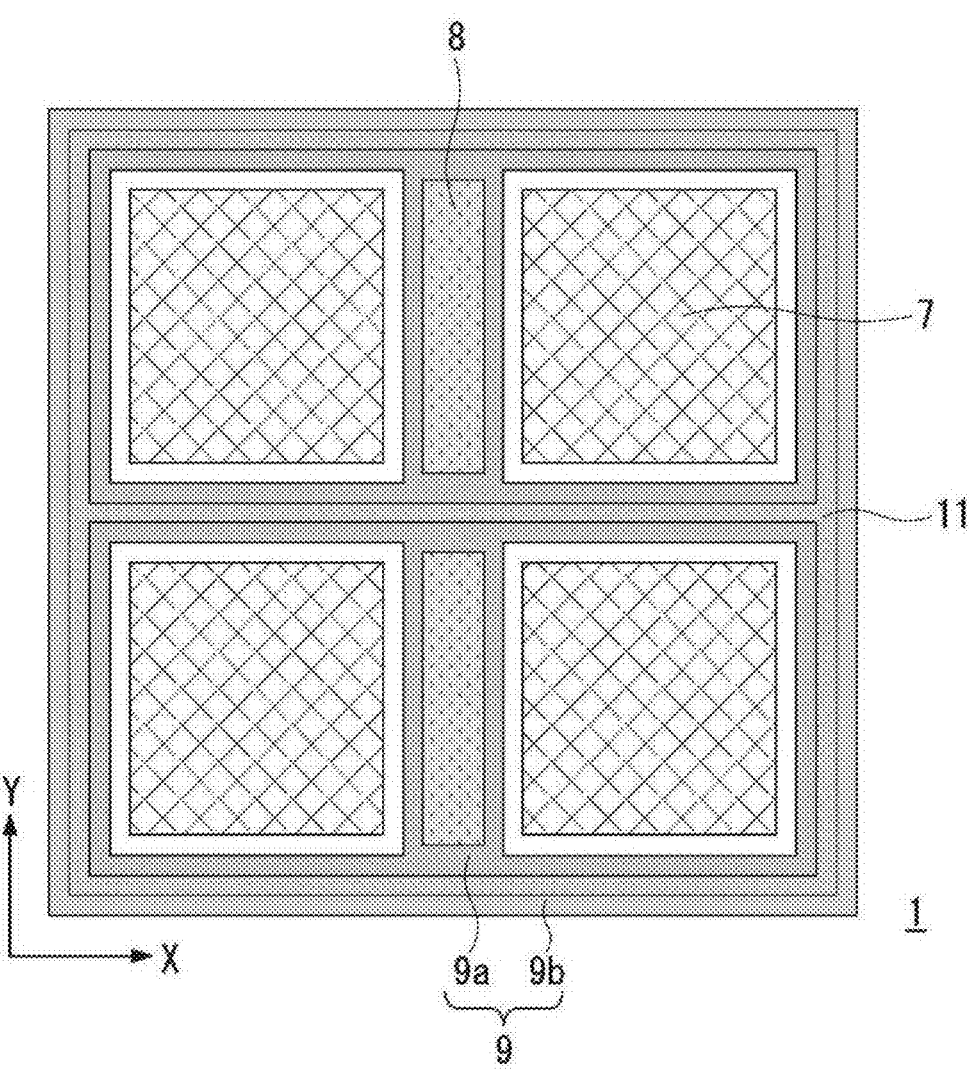
FIG. 10 is a layout diagram illustrating an example in which two pixels share one lower electrode.

FIG. 10 is a layout diagram illustrating an example in which two pixels share one lower electrode 8. In FIG. 10, the lower electrode 8 is disposed between the two storage electrodes 7 arranged in the lateral direction X, and the shield electrode 11 is disposed so as to surround the two storage electrodes 7. The shield electrode 11 is disposed between the two storage electrodes 7 arranged in the longitudinal direction Y. In FIG. 10, the first diffusion region 9a covering the lower electrode 8 and the second diffusion region 9b covering the shield electrode 11 are connected, and the first diffusion region 9a and the second diffusion region 9b are set to the same potential.

Figure 11:
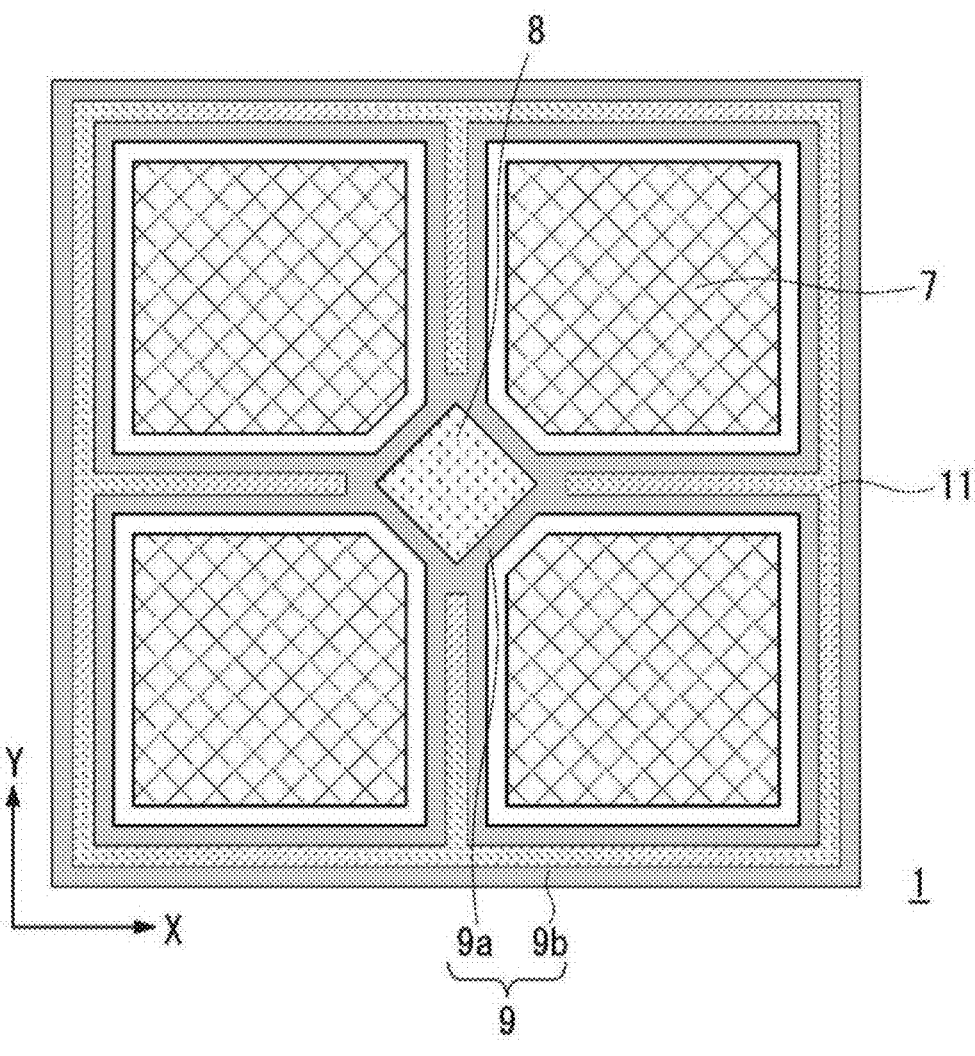
FIG. 11 is a layout diagram illustrating an example in which four pixels share one lower electrode.

FIG. 11 is a layout diagram illustrating an example in which four pixels share one lower electrode 8. In FIG. 11, the lower electrode 8 is disposed at the center of a total of four storage electrodes 7 including two storage electrodes 7 arranged in the lateral direction X and two storage electrodes 7 arranged in the longitudinal direction Y. The shield electrode 11 is disposed so as to surround the periphery of each storage electrode 7 and the periphery of the lower electrode 8. The first diffusion region 9a covering the lower electrode 8 and the second diffusion region 9b covering the shield electrode 11 are connected.

As illustrated in FIGS. 10 and 11, by sharing the lower electrode 8 by a plurality of pixels, the size of the storage electrode 7 can be increased, and sensitivity can be improved. Alternatively, the pixel size can be reduced without changing the size of the storage electrode 7, and miniaturization can be achieved.

Figure 12:
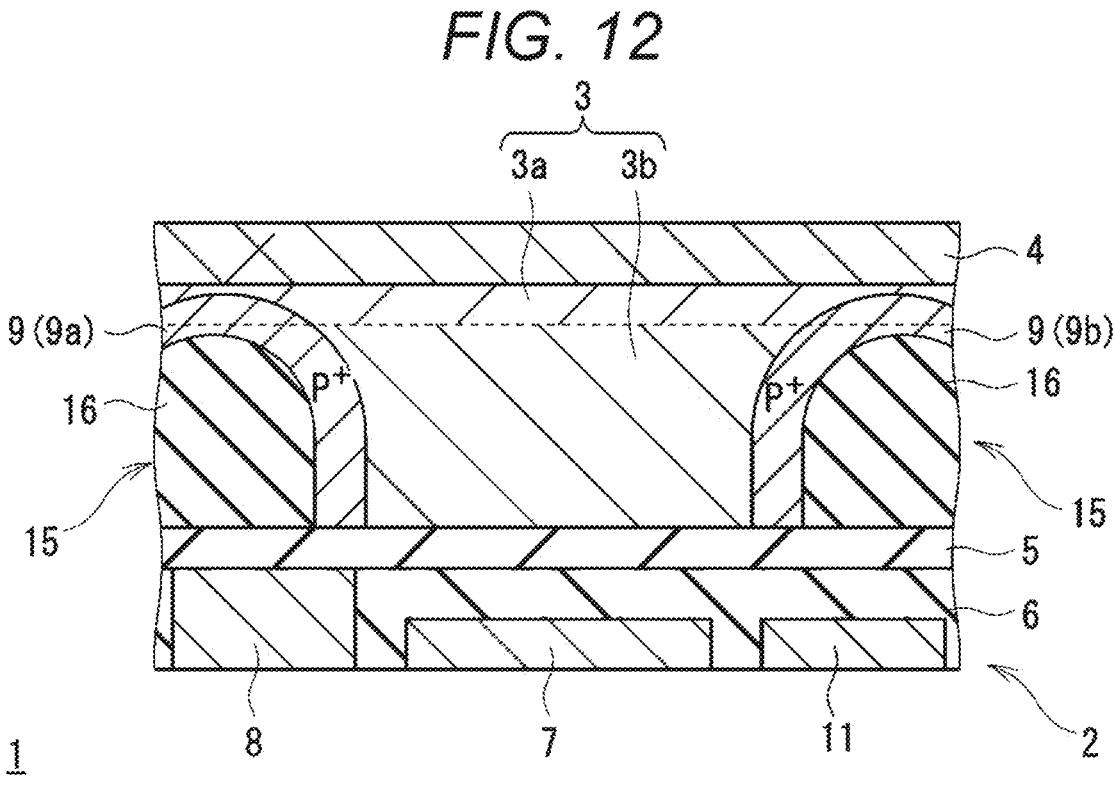
FIG. 12 is a layout diagram according to a fourth modification of the solid-state imaging device in FIG. 4.

FIG. 12 is a layout diagram according to a fourth modification of the solid-state imaging device 1 in FIG. 4. In the solid-state imaging device 1 of FIG. 12, a trench 15 is arranged in the photoelectric conversion part 3, and impurity ions are implanted and diffused into the trench 15, thereby forming an impurity ion diffusion region 9 in the photoelectric conversion part 3. Since the depth of the trench 15 can be controlled relatively accurately, by implanting and diffusing impurity ions into the trench 15, diffusion control of impurity ions in the depth direction from the interface with the first insulating film 5 of the photoelectric conversion part 3 can be performed more accurately, and miniaturization can be performed. Note that the trench 15 is filled with a filling material. The filling material may be an insulating material or a mixed material of an insulating material and a metal material. In this manner, a columnar body 16 is formed by filling the inside of the trench 15 with an insulating material or the like. In FIG. 12, an impurity ion diffusion region 9 is disposed in the photoelectric conversion part 3 from the surface of the columnar body 16.

Since the impurity ion diffusion region 9 in FIG. 12 extends from the bottom of the trench 15 toward the upper electrode 4, it can be relatively easily extended in the depth direction to a position electrically connected to the upper electrode 4. As a result, the potential of the impurity ion diffusion region 9 can be set with the upper electrode 4.

Figure 13:
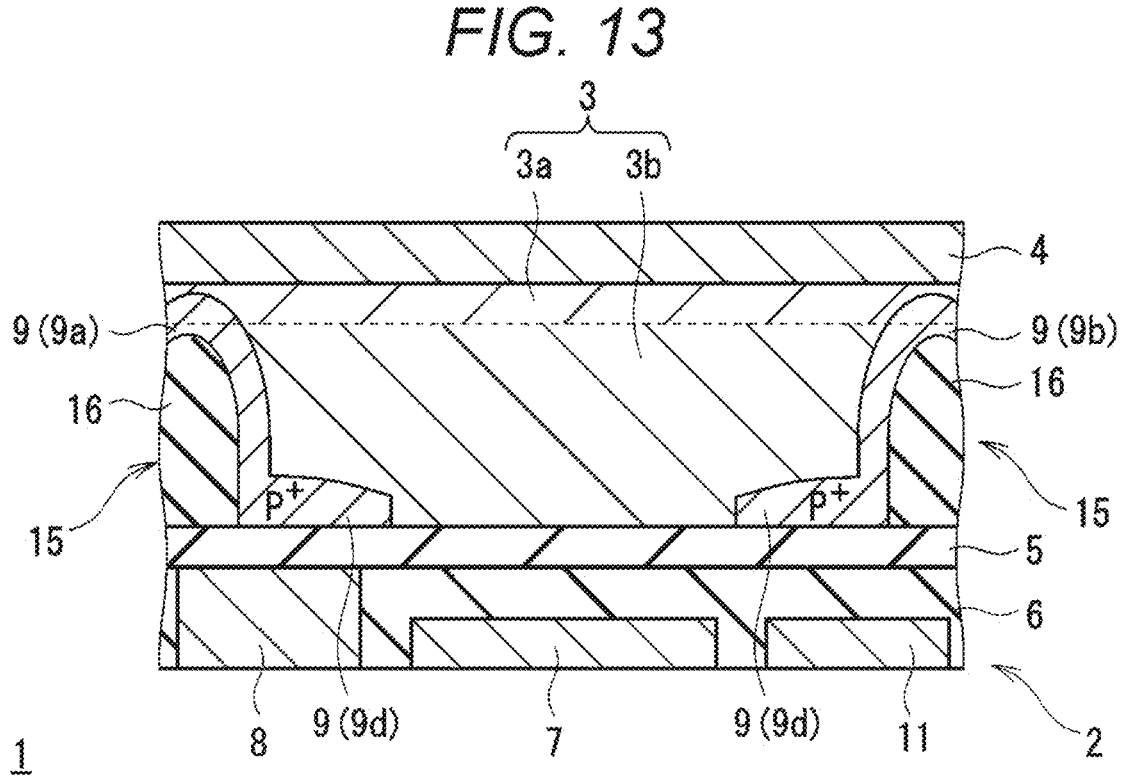
FIG. 13 is a cross-sectional view according to a fifth modification of the solid-state imaging device in FIG. 4.

FIG. 13 is a cross-sectional view according to a fifth modification of the solid-state imaging device 1 in FIG. 4. Similarly to FIG. 12, the solid-state imaging device 1 of FIG. 13 forms the trench 15 in the photoelectric conversion part 3, and then implants and diffuses impurity ions into the trench 15 to form a first impurity ion diffusion region 9c having a large depth and form a second impurity ion diffusion region 9d having a shallow depth adjacent to the first impurity ion diffusion region 9c.

The second impurity ion diffusion region 9d has a shallow depth, but has a large spread in the plane direction. The photoelectric conversion part 3 is disposed between the second impurity ion diffusion region 9d and the upper electrode 4 at the position where the second impurity ion diffusion region 9d is disposed, and photoelectric conversion can be performed. As described above, by providing the second impurity ion diffusion region 9d having a shallow depth in addition to the first impurity ion diffusion region 9c, it is possible to more reliably prevent the charge from flowing into the lower electrode 8 while the first insulating film 5 accumulates the charge, and it is possible to perform photoelectric conversion around the second impurity ion diffusion region 9d, so that sensitivity can be improved. Since the first impurity ion diffusion region 9c can be fixed at a predetermined potential by narrowing the width of the first impurity ion diffusion region 9c in the plane direction and bringing the first impurity ion diffusion region 9c into contact with the upper electrode 4, it is not necessary to provide a contact connected to the first impurity ion diffusion region 9c and the second impurity ion diffusion region 9d, and miniaturization is possible.

Figure 14:
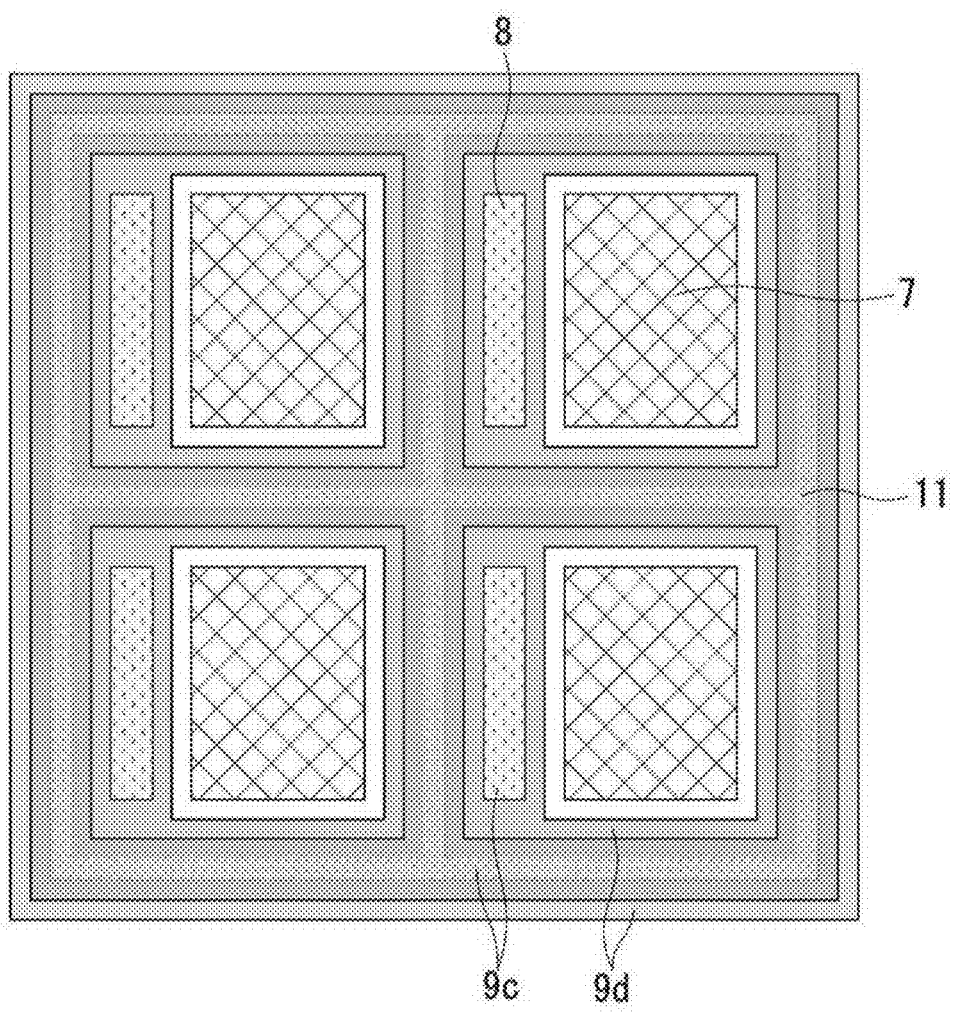
FIG. 14 is a layout diagram of the solid-state imaging device in FIG. 13.

FIG. 14 is a layout diagram of the solid-state imaging device 1 in FIG. 13. The periphery of the storage electrode 7 and the lower electrode 8 is surrounded by a first impurity ion diffusion region 9c having a large depth. The lower electrode 8 is covered with a second impurity ion diffusion region 9d having a shallow depth. As described above, by providing the two types of impurity ion diffusion regions 9 having different depths, it is possible not only to reliably prevent the charge from flowing into the lower electrode 8 while the charge is accumulated in the first insulating film 5, but also to perform photoelectric conversion above the position where the second impurity ion diffusion region 9d having a shallow depth is disposed (on the upper electrode 4 side), and to improve the sensitivity.

Figure 15:
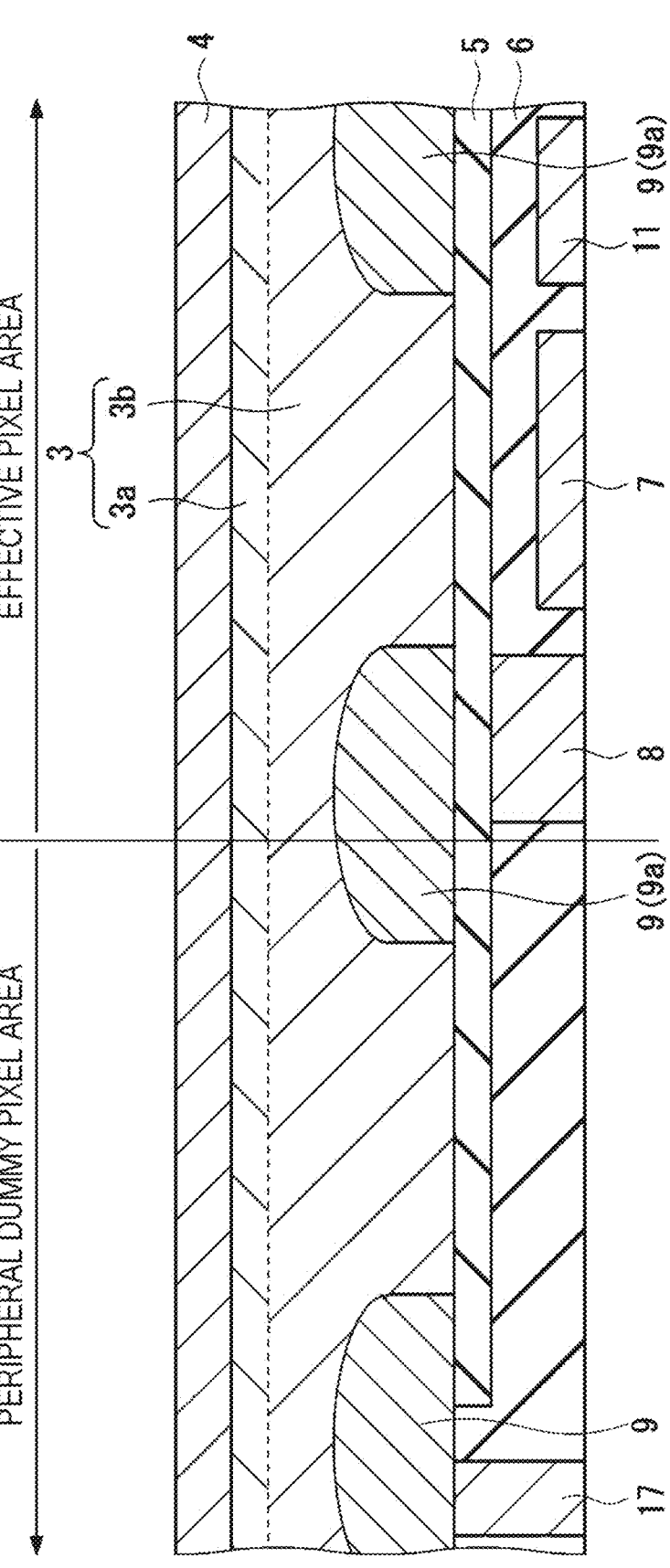
FIG. 15 is a cross-sectional view illustrating an example of a contact connected to an impurity ion diffusion region.

The impurity ion diffusion region 9 illustrated in FIGS. 1, 2A, 2B, 3, 4, 5, 6, 7, 8, 9, 10, 11, 12, 13, and 14 is fixed at a predetermined potential. In order to fix the impurity ion diffusion region 9 at a predetermined potential, a contact is connected to the impurity ion diffusion region 9, and a predetermined potential is applied to the contact. FIG. 15 is a cross-sectional view illustrating an example of a contact 17 connected to an impurity ion diffusion region 9. In the example of FIG. 15, a peripheral dummy pixel area that does not contribute to imaging is provided outside an effective pixel area in which imaging is performed, and an impurity ion diffusion region 9 connected to the contact 17 is provided in the peripheral pixel area. The photoelectric conversion part 3 is provided with a plurality of impurity ion diffusion regions 9 for each pixel, but as illustrated in FIG. 6, for example, all the impurity ion diffusion regions 9 are connected. Therefore, by connecting the contact 17 to the impurity ion diffusion region 9 in the peripheral dummy pixel area and applying a predetermined potential, the potentials of all the impurity ion diffusion regions 9 in the photoelectric conversion part 3 can be fixed.

On the other hand, as illustrated in FIGS. 7, 9, and the like, in a case where the impurity ion diffusion region 9a covering the lower electrode 8 and the impurity ion diffusion region 9b covering the shield electrode 11 are separated from each other, for example, the impurity ion diffusion region 9b covering the shield electrode 11 is connected to the impurity ion diffusion region 9 in the peripheral dummy pixel area, so that the potential can be fixed in the same manner as in FIG. 15. For the impurity ion diffusion region 9a covering the lower electrode 8, a contact connected to the impurity ion diffusion region 9a covering the lower electrode 8 may be provided for each pixel, and a predetermined potential may be applied to this contact.

Figure 16:
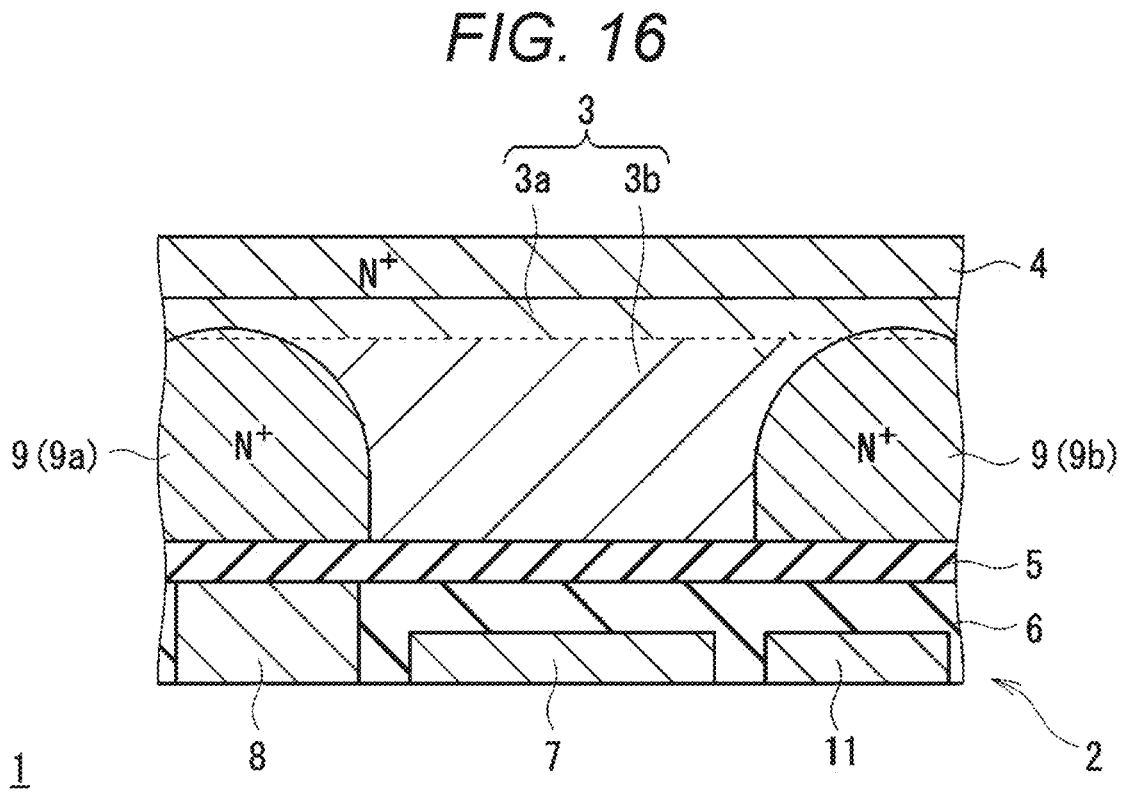
FIG. 16 is a diagram illustrating a cross-sectional structure of a first substrate of the solid-state imaging device.

In FIGS. 1, 2A, 2B, 3, 4, 5, 6, 7, 8, 9, 10, 11, 12, 13, and 14 described above, an example in which electrons photoelectric-converted by the photoelectric conversion part 3 are accumulated in the first insulating film 5 and transferred to the lower electrode 8 has been described, but instead of electrons, holes may be accumulated in the first insulating film 5 and transferred to the lower electrode 8. FIG. 16 is a cross-sectional view of the solid-state imaging device 1 that accumulates holes in the first insulating film 5 and transfers the holes to the lower electrode 8.

FIG. 16 illustrates a cross-sectional structure of the first substrate 2 of the solid-state imaging device 1. In practice, as illustrated in FIG. 4, the wiring layer on the first substrate 2 and the wiring layer on the second substrate 10 are connected and stacked by Cu—Cu bonding or the like.

The first substrate 2 of FIG. 16 includes a photoelectric conversion part 3, an upper electrode 4 disposed on one main surface of the photoelectric conversion part 3, a first insulating film 5 disposed on one main surface opposite to the photoelectric conversion part 3, a second insulating film 6 disposed on the first insulating film 5, and a storage electrode 7, a lower electrode 8, and a shield electrode 11 arranged separately from each other on the second insulating film 6.

The photoelectric conversion part 3 includes an N+layer 3c and a P layer or a Non-doped layer (i layer) 3d. The P layer or the i layer 3d is disposed on the side in contact with the first insulating film 5, and the N+layer 3c is disposed on the side in contact with the upper electrode 4. The first insulating film 5 has a potential capable of accumulating and transferring holes photoelectric-converted by the photoelectric conversion part 3.

The photoelectric conversion part 3 is provided with an impurity ion diffusion region 9 (first diffusion region 9a) covering the lower electrode 8 and an impurity ion diffusion region 9 (second diffusion region 9b) covering the shield electrode 11. The first diffusion region 9a and the second diffusion region 9b are regions in which N+ impurity ions are diffused. Therefore, when holes photoelectric-converted by the photoelectric conversion part 3 flow into the first diffusion region 9a or the second diffusion region 9b, the holes recombine with electrons in the first diffusion region 9a or the second diffusion region 9b. Therefore, it is possible to avoid the possibility that holes flow from the first diffusion region 9a into the lower electrode 8.

As described above, in the solid-state imaging device 1 in FIG. 16, the conductivity types of the photoelectric conversion part 3 and the impurity ion diffusion region 9 are different from those in FIG. 1 and the like, and the material of the first insulating film 5 is also different from that of the first insulating film 5 in FIG. 1. The material of the first insulating film 5 in FIG. 16 is, for example, NiO, MoOx, or the like.

Figure 17A:
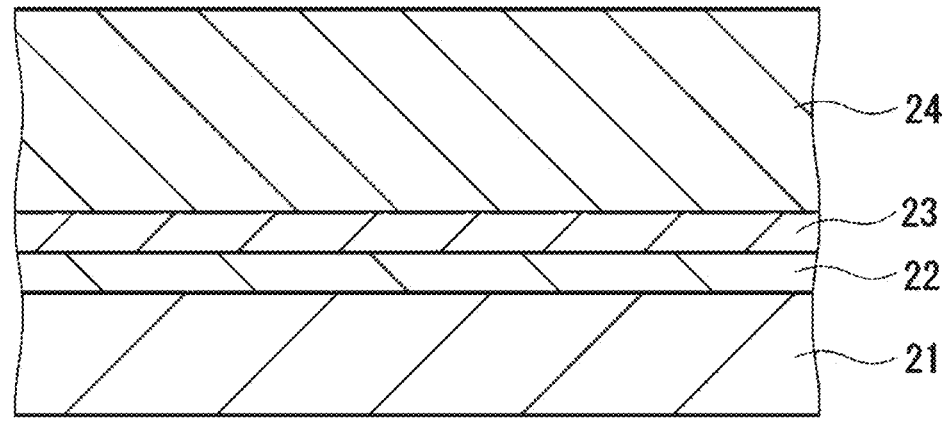
FIG. 17A is a process diagram illustrating a manufacturing process of the solid-state imaging device in FIG. 4.

FIGS. 17A, 17B, 17C, 17D, 17E, 17F, 17G, 17H, 17I, 17J, 17K, and 17L are process diagrams illustrating a manufacturing process of the solid-state imaging device 1 in FIG. 4. First, as illustrated in FIG. 17A, an InGaAs layer 22, a P+InP layer 23, and an i (or N)—InGaAs layer 24 are sequentially epitaxially grown on an InP substrate 21.

Figure 17B:
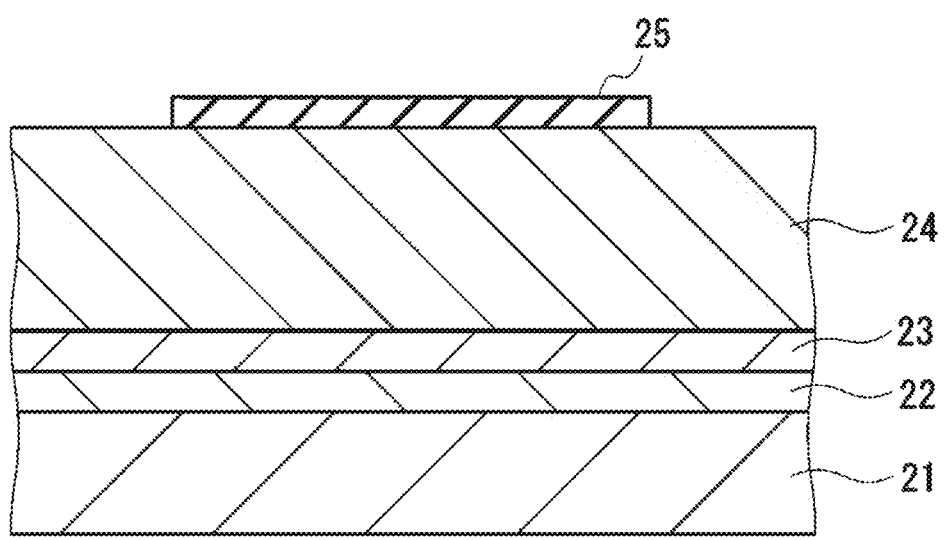
FIG. 17B is a process diagram following FIG. 17A.
Figure 17C:
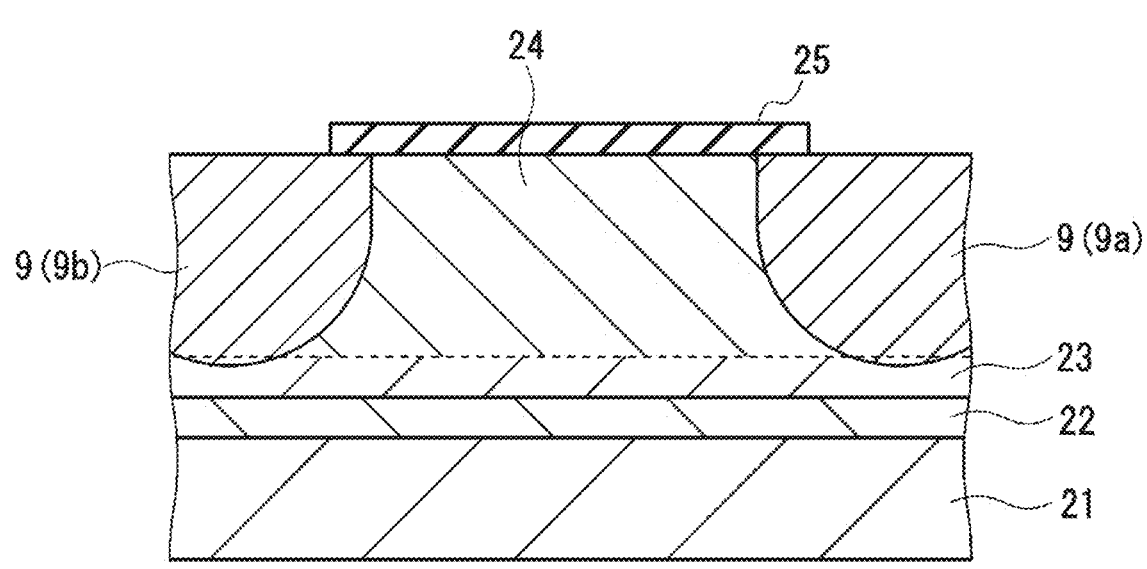
FIG. 17C is a process diagram following FIG. 17B.

Next, as illustrated in FIG. 17B, a hard mask 25 is formed on the i (or N)—InGaAs layer 24. Next, as illustrated in FIG. 17C, impurity ions (for example, Zn ions) are implanted and diffused through the hard mask 25 to form the impurity ion diffusion region 9. Here, impurity ions of P+ are diffused so that the impurity ions reach the InP substrate 21.

Figure 17D:
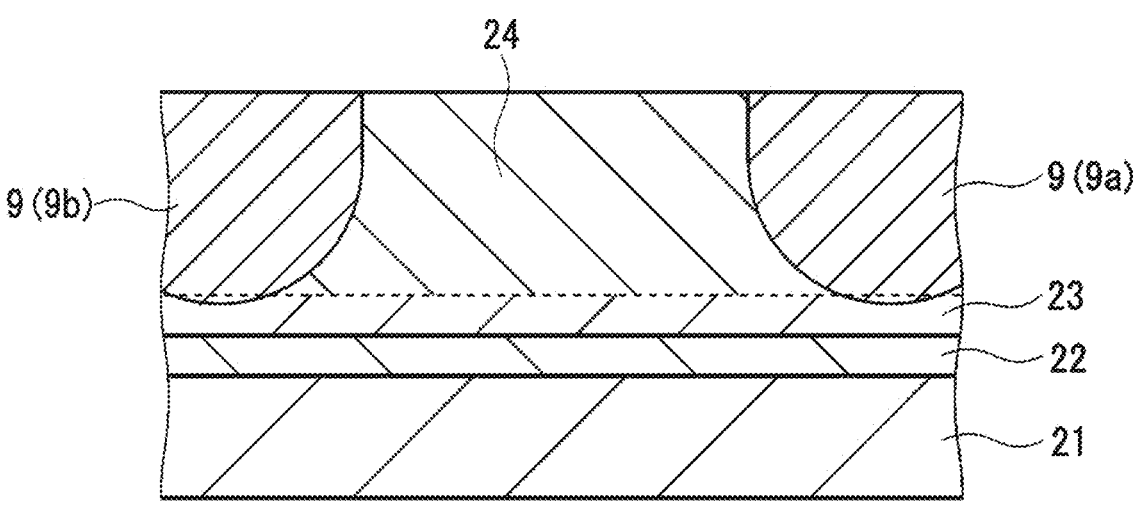
FIG. 17D is a process diagram following FIG. 17C.
Figure 17E:
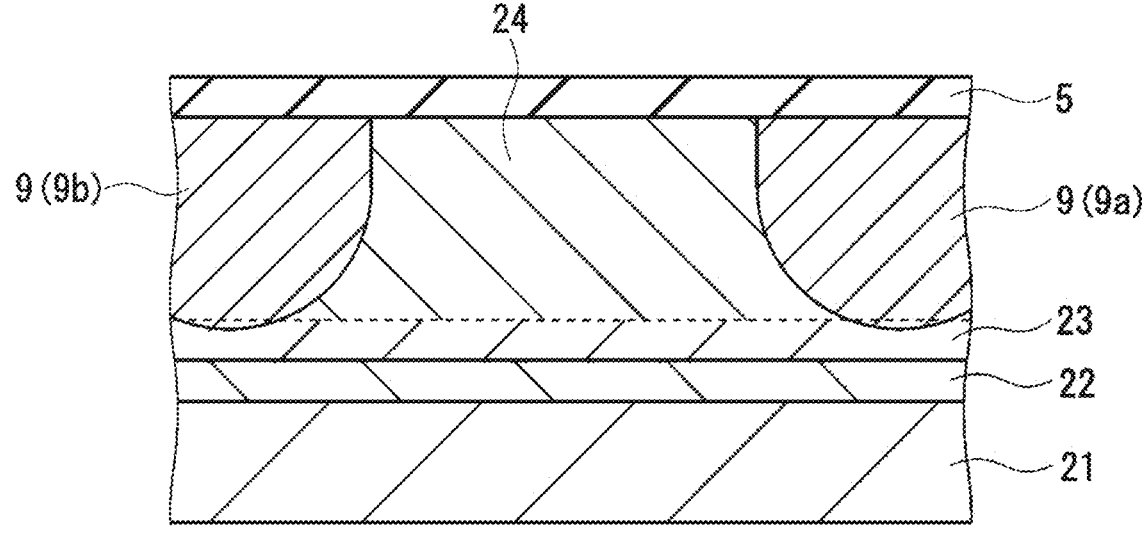
FIG. 17E is a process diagram following FIG. 17D.
Figure 17F:
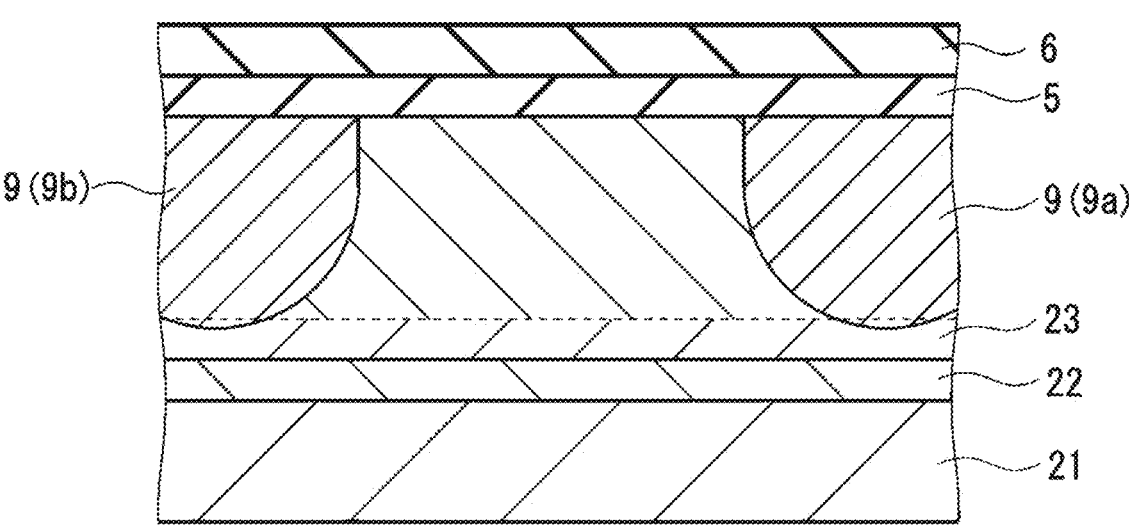
FIG. 17F is a process diagram following FIG. 17E.
Figure 17G:
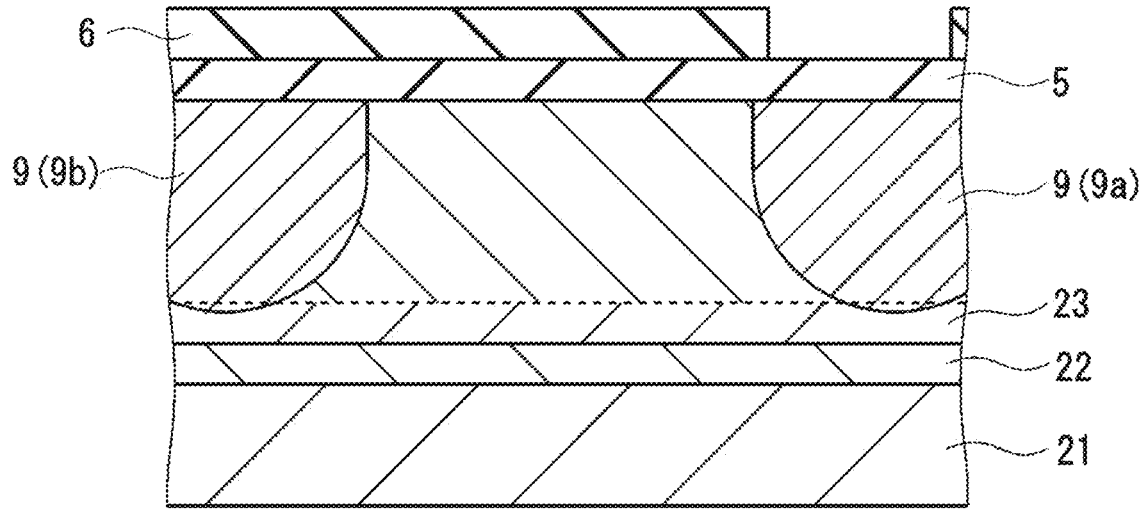
FIG. 17G is a process diagram following FIG. 17F.
Figure 17H:
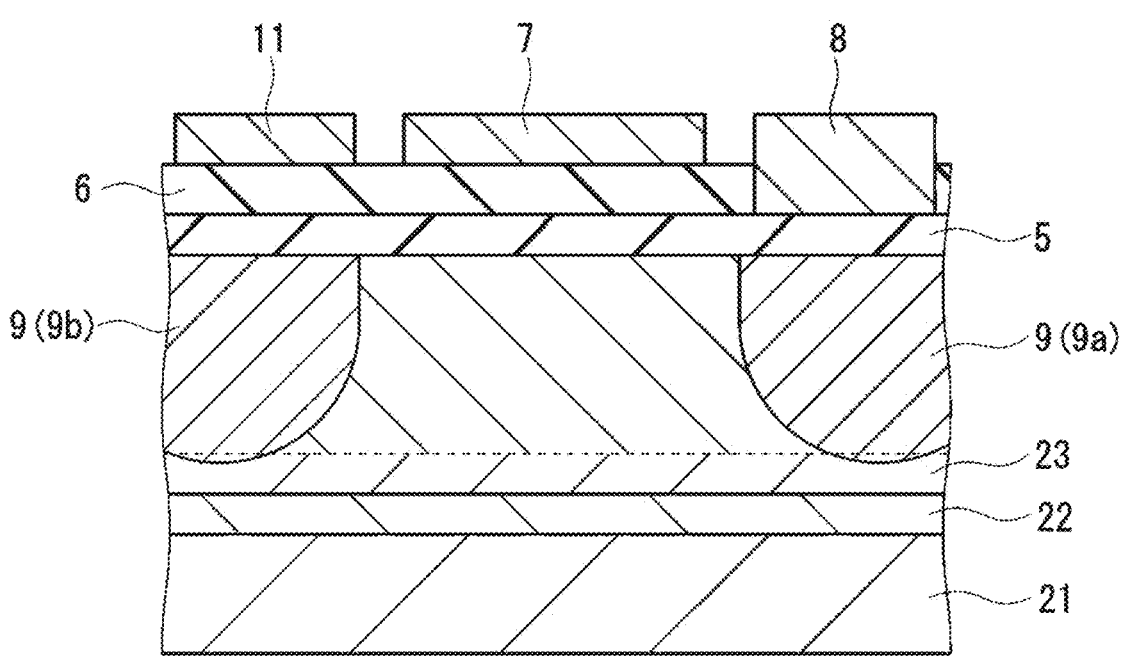
FIG. 17H is a process diagram following FIG. 17G.

Next, after the hard mask 25 is removed as illustrated in FIG. 17D, the first insulating film 5 including IGZO or the like is formed on the i (or N)—InGaAs layer 24 and the impurity ion diffusion region 9 as illustrated in FIG. 17E. Next, as illustrated in FIG. 17F, a second insulating film 6 including SiO2 or the like is formed on the first insulating film 5. Next, as illustrated in FIG. 17G, an opening is formed in the second insulating film 6 by patterning the second insulating film 6 by lithography. Next, as illustrated in FIG. 17H, the lower electrode 8 is formed in the opening portion of the second insulating film 6, and the storage electrode 7 and the shield electrode 11 are formed on the second insulating film 6.

Figure 17I:
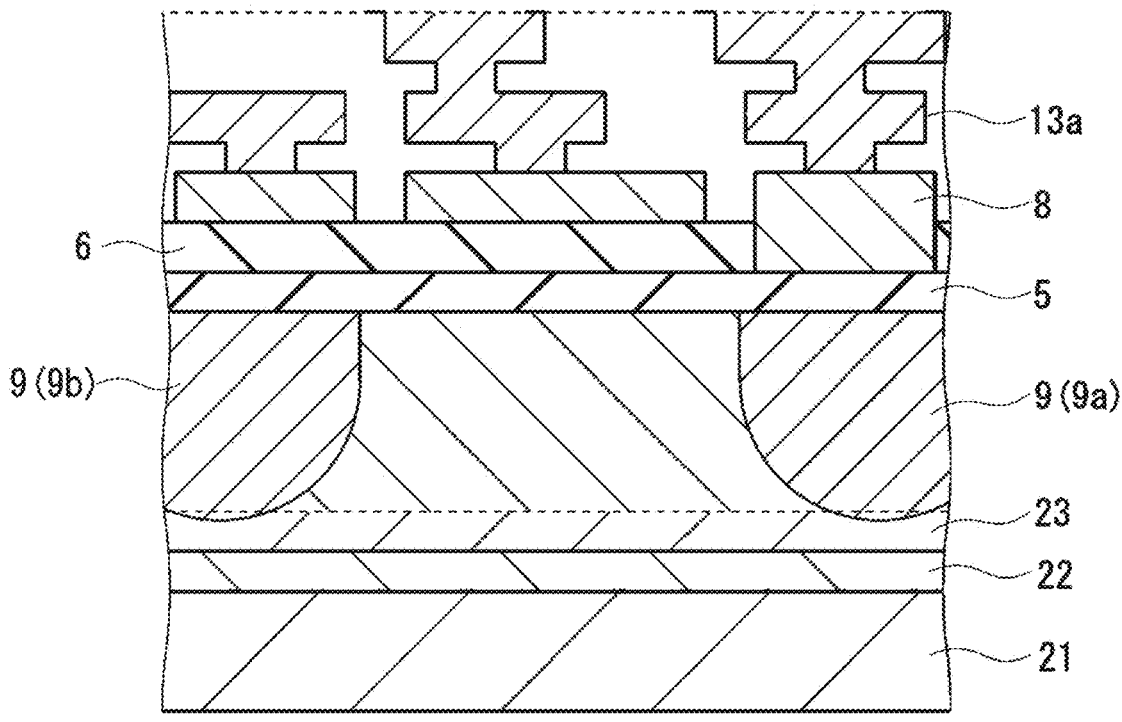
FIG. 17I is a process diagram following FIG. 17H.
Figure 17J:
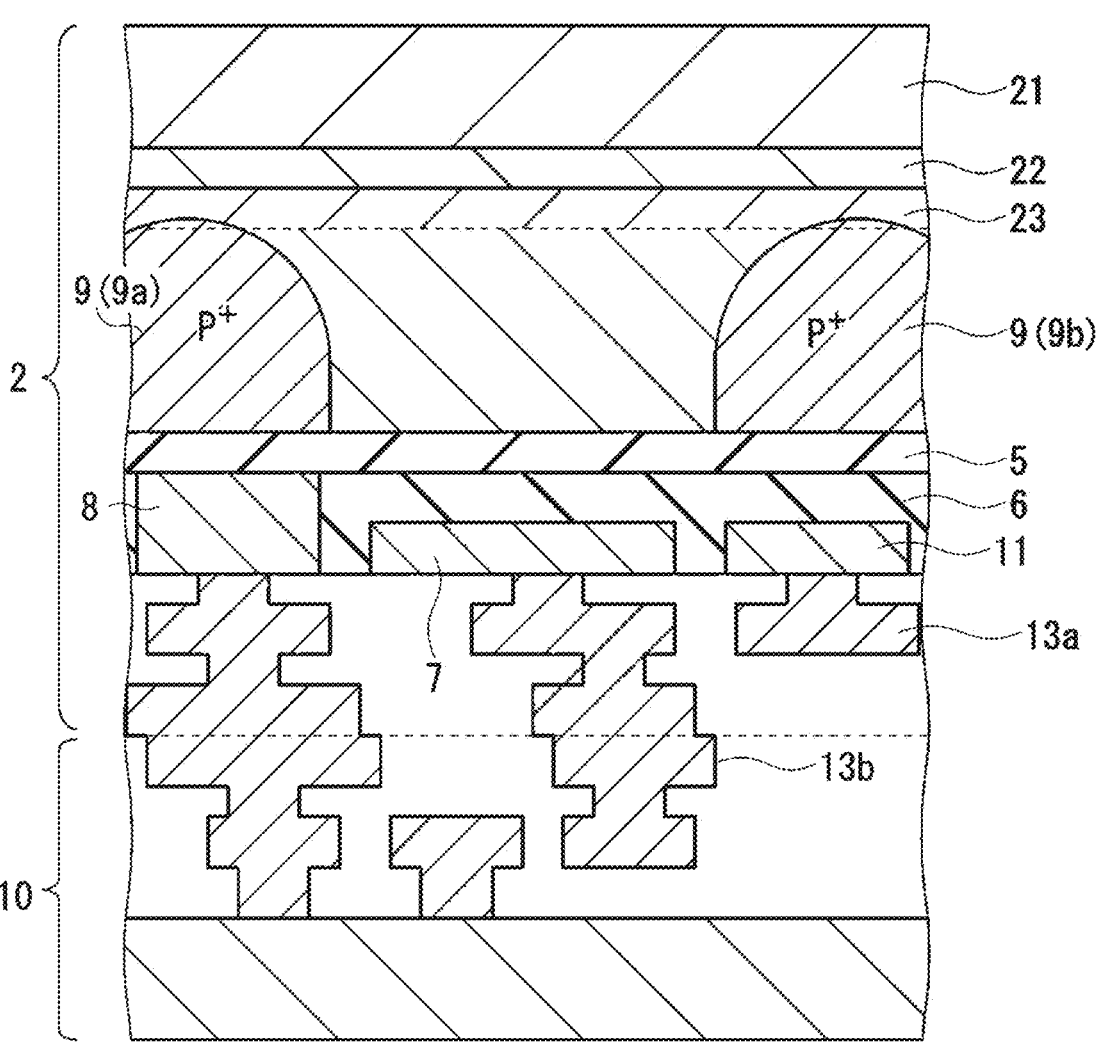
FIG. 17J is a process diagram following FIG. 17I.

Next, as illustrated in FIG. 17I, a wiring layer 13a connected to each of the storage electrode 7, the lower electrode 8, and the shield electrode 11 is formed. Next, as illustrated in FIG. 17J, the first substrate 2 subjected to the steps up to the step in FIG. 17I and the second substrate 10 on which the wiring layer 13b is formed are stacked. Here, the wiring layer 13a of the first substrate 2 and the wiring layer 13b of the second substrate 10 are connected by Cu—Cu bonding, bumps, vias, or the like.

Figure 17K:
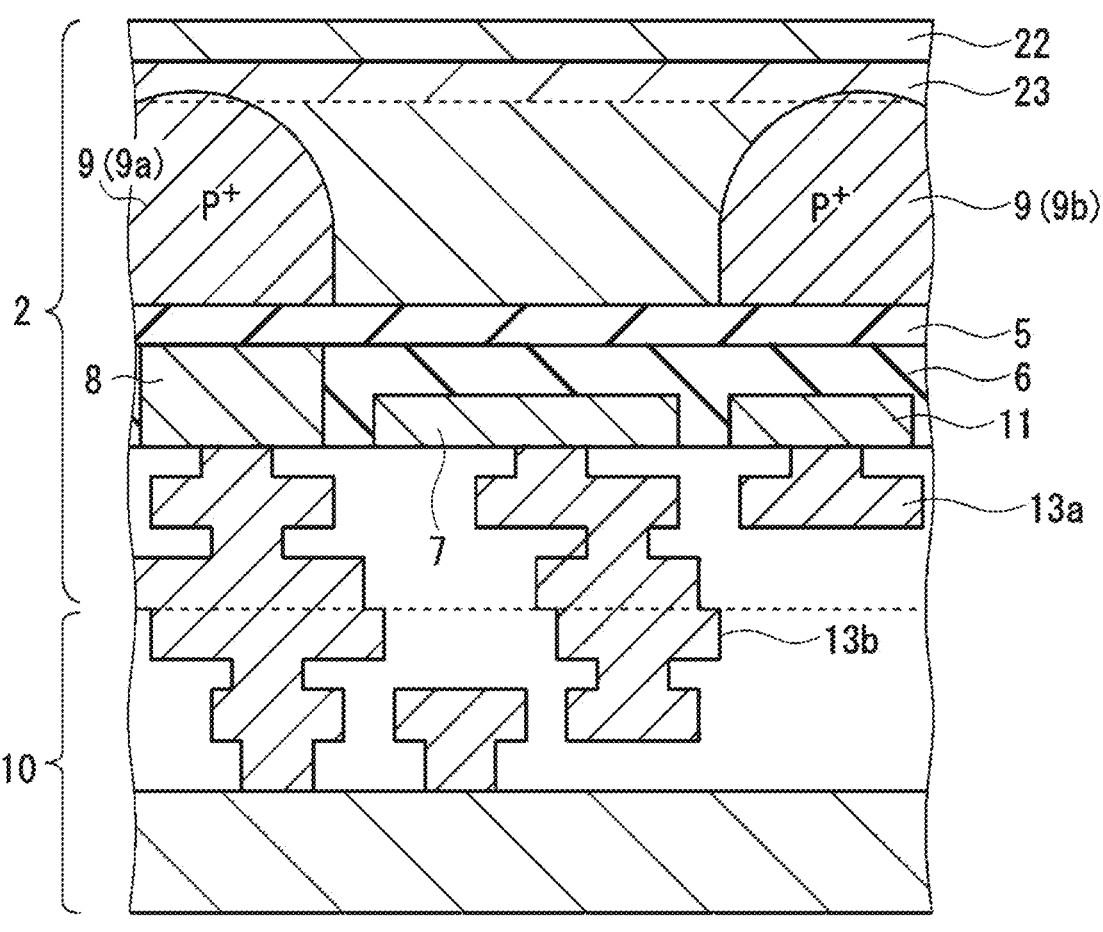
FIG. 17K is a process diagram following FIG. 17J.
Figure 17L:
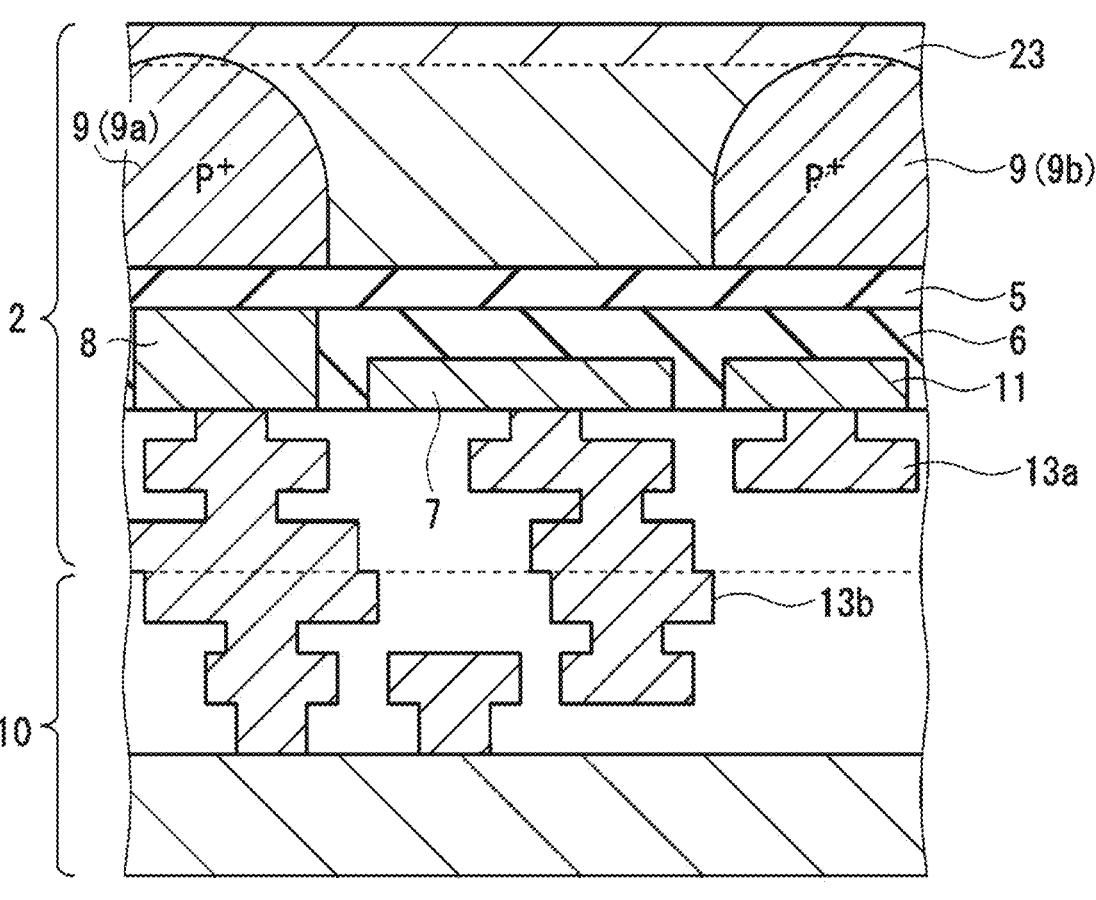
FIG. 17L is a process diagram following FIG. 17K.

Next, as illustrated in FIG. 17K, the InP substrate 21 on the first substrate 2 is etched and removed using the InGaAs layer 22 in the first substrate 2 as an etching stopper. Next, as illustrated in FIG. 17L, the InGaAs layer 22 of the first substrate 2 is removed to expose the P+InP layer 23. Next, as illustrated in FIG. 4, the upper electrode 4 is formed on the P+InP layer 23.

As described above, in the solid-state imaging device 1 according to the first embodiment, since the impurity ion diffusion region 9 is formed in the photoelectric conversion part 3 so as to face at least the lower electrode 8, there is no possibility that a part of the charge flows from the photoelectric conversion part 3 into the lower electrode 8 while the charge photoelectric-converted by the photoelectric conversion part 3 is accumulated in the first insulating film 5. In addition, by forming the impurity ion diffusion region 9 in the photoelectric conversion part 3 so as to face the shield electrode 11, it is also possible to prevent charges from flowing into the shield electrode 11. Therefore, according to the present embodiment, noise in the captured image can be suppressed.

Second Embodiment

The solid-state imaging device 1 illustrated in FIG. 1 and the like illustrates an example of photoelectric-converting light in a single optical wavelength range, and the optical wavelength range is, for example, infrared light or a far-infrared light band. On the other hand, a solid-state imaging device 1 according to a second embodiment described below performs photoelectric conversion by dividing light into a plurality of optical wavelength bands.

Figure 18:
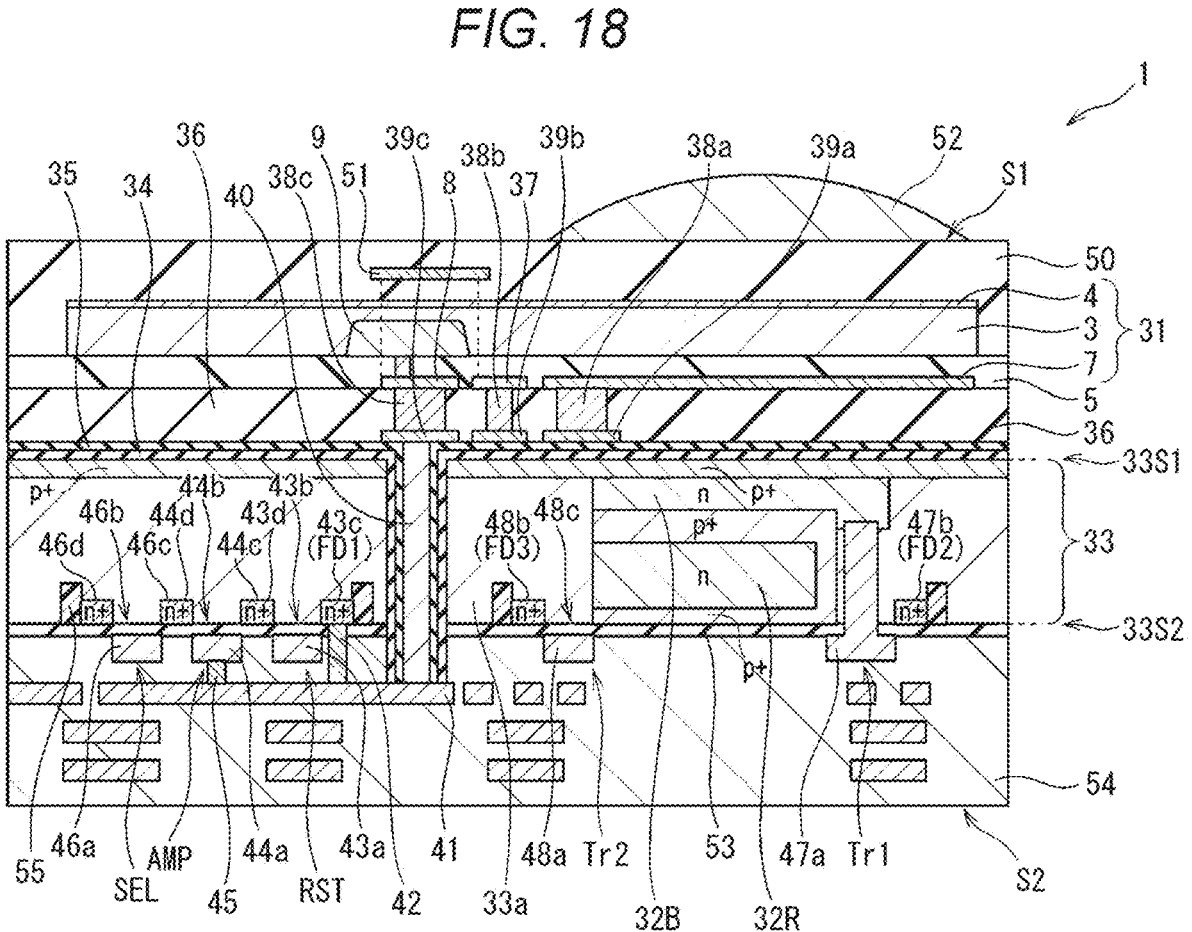
FIG. 18 is a cross-sectional view of a unit pixel of a solid-state imaging device according to a second embodiment.
Figure 19:
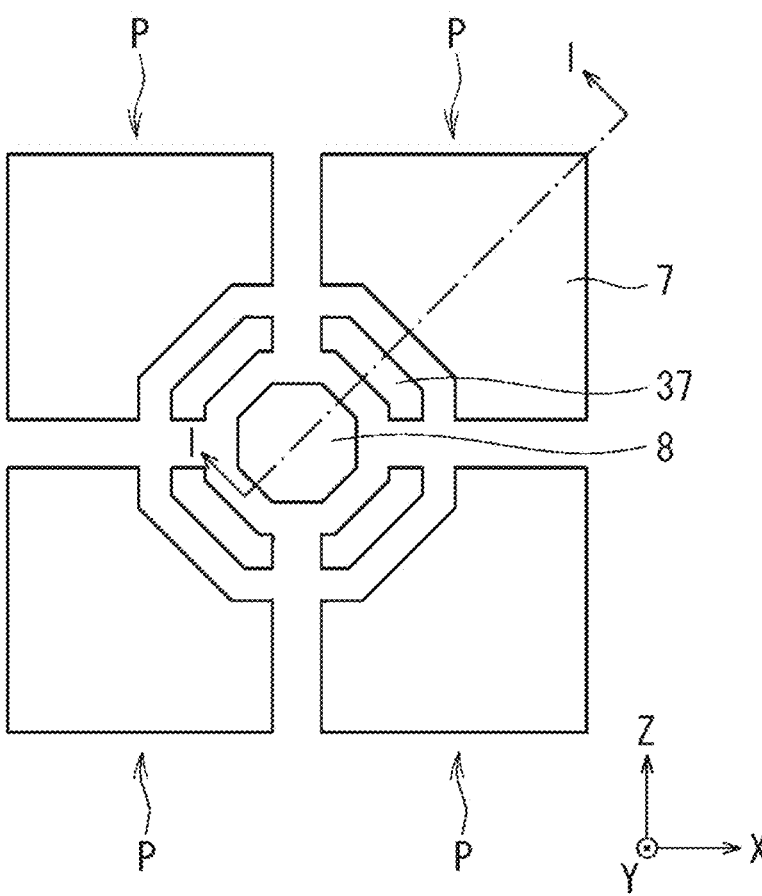
FIG. 19 is a layout diagram illustrating a planar arrangement of lower electrodes and storage electrodes of the solid-state imaging device in FIG. 18.

FIG. 18 is a cross-sectional view of a unit pixel of a solid-state imaging device 1 according to the second embodiment. FIG. 19 is a layout diagram illustrating a planar arrangement of the lower electrode 8 and the storage electrodes 7 of the solid-state imaging device 1 of FIG. 18. As illustrated in FIG. 19, in the solid-state imaging device 1 of FIG. 18, four unit pixels P share one lower electrode 8, and the storage electrode 7 is arranged for each unit pixel P. FIG. 18 illustrates a cross-sectional structure taken along line A-A in FIG. 19.

The solid-state imaging device 1 in FIG. 18 has a so-called longitudinal spectroscopic configuration in which one organic photoelectric conversion part 31 and two inorganic photoelectric conversion parts 32R and 32B are stacked in the longitudinal direction. The two inorganic photoelectric conversion parts 32R and 32B are arranged inside a semiconductor substrate 33. A fixed charge layer 34, a dielectric layer 35, and an interlayer insulating layer 36 are sequentially stacked between the semiconductor substrate 33 and the organic photoelectric conversion part 31.

The organic photoelectric conversion part 31 includes a storage electrode 7, a barrier adjustment electrode 37, and a lower electrode 8 arranged on the interlayer insulating layer 36, a first insulating film 5 disposed on the electrodes 7, 37, and 8, a photoelectric conversion part 3 disposed on the first insulating film 5, and an upper electrode 4 disposed on the photoelectric conversion part 3.

An impurity ion diffusion region 9 is formed around a portion of the photoelectric conversion part 3 connected to the lower electrode 8 as in FIG. 1. Therefore, it is possible to prevent charges from flowing into the lower electrode 8 while the first insulating film 5 stores the charges photoelectric-converted by the photoelectric conversion part 3.

The storage electrode 7, the barrier adjustment electrode 37, and the lower electrode 8 are connected to the pads 39a, 39b, and 39c via contacts 38a, 38b, and 38c, respectively. The pad 39c below the lower electrode 8 is connected to a through electrode 40 extending in the depth direction. The through electrode 40 is connected to a connecting portion 41 extending in the substrate surface direction, and the connecting portion 41 is connected to a floating diffusion FD1 via a contact 42. A reset transistor RST resets the charge transferred from the organic photoelectric conversion part 31 to the floating diffusion FD1. The reset transistor RST includes a reset gate 43a, a channel formation region 43b, and source/drain regions 43c and 43d. One source/drain region 43c of the reset transistor RST also serves as the floating diffusion FD1. The other source/drain region 43d constituting the reset transistor RST is connected to the power supply VDD.

The amplifier transistor AMP modulates the amount of charge generated in the organic photoelectric conversion part 31 to a voltage. Specifically, the amplifier transistor AMP includes a gate 44a, a channel formation region 44b, and source/drain regions 44c and 44d. The gate 44a is connected to one source/drain region 43c (floating diffusion FD1) of the reset transistor RST via a lower first contact 45, the connecting portion 41, and a lower second contact 42. Furthermore, one source/drain region 44c of the amplifier transistor AMP shares a region with the other source/drain region 43d constituting the reset transistor RST, and is connected to the power supply VDD.

A selection transistor SEL includes a gate 46a, a channel formation region 46b, and source/drain regions 46c and 46d. The gate 46a is connected to a selection line SEL1. Furthermore, one source/drain region 46c shares a region with the other source/drain region 44d constituting the amplifier transistor AMP, and the other source/drain region 46d is connected to a signal line (data output line) (not illustrated).

Each of the inorganic photoelectric conversion parts 32R and 32B has a pn junction in a predetermined region of the semiconductor substrate 33. The inorganic photoelectric conversion parts 32R and 32B can disperse light in the longitudinal direction by utilizing the fact that the wavelength of light absorbed in the silicon substrate varies depending on the incident depth of light.

The inorganic photoelectric conversion part 32B selectively detects blue light and accumulates signal charges corresponding to blue, and is installed at a depth at which blue light can be efficiently photoelectric-converted. The inorganic photoelectric conversion part 32R selectively detects red light and accumulates signal charges corresponding to red, and is installed at a depth at which red light can be efficiently photoelectric-converted. Note that blue (B) is a color corresponding to, for example, a wavelength region of 450 nm to 495 nm, and red (R) is a color corresponding to, for example, a wavelength region of 620 nm to 750 nm.

Each of the inorganic photoelectric conversion parts 32R and 32B only needs to be able to detect light in a part or all of the wavelength regions.

The inorganic photoelectric conversion part 32R, 32B includes, for example, a p+ region serving as a hole accumulation layer and an n region serving as an electron accumulation layer. The inorganic photoelectric conversion part 32R, 32B includes, for example, a p+ region serving as a hole accumulation layer and an n region serving as an electron accumulation layer (have a stacked structure of p-n-p). The n region of the inorganic photoelectric conversion part 32R, 32B is connected to a vertical transfer transistor Tr1. The p+ region of the inorganic photoelectric conversion part 32R, 32B is bent along a transfer transistor Tr2.

The transfer transistor Tr1 transfers the signal charge corresponding to blue (here, the electron) generated and accumulated in the inorganic photoelectric conversion part 32B to a floating diffusion FD2. Since the inorganic photoelectric conversion part 32B is formed at a position deep from a second surface 33S2 of the semiconductor substrate 33, the transfer transistor Tr1 of the inorganic photoelectric conversion part 32B is preferably configured by a vertical transistor. In addition, the transfer transistor Tr1 is connected to a transfer gate line (not illustrated). Further, the floating diffusion FD2 is provided in a region 47b in the vicinity of a gate 47a of the transfer transistor Tr1. The charges accumulated in the inorganic photoelectric conversion part 32B are read out to the floating diffusion FD2 via a transfer channel formed along the gate 47a.

The transfer transistor Tr2 transfers signal charges (here, the electron) corresponding to red generated and accumulated in the inorganic photoelectric conversion part 32R to a floating diffusion FD3, and includes, for example, a MOS transistor. In addition, the transfer transistor Tr2 is connected to a transfer gate line (not illustrated). Further, the floating diffusion FD3 is provided in a region 48b in the vicinity of a gate 48a of the transfer transistor Tr2. The charges accumulated in the inorganic photoelectric conversion part 32R are read out to the floating diffusion FD3 via a transfer channel 48c formed along the gate 48a.

As described above, also in the solid-state imaging device 1 according to the second embodiment, since the impurity ion diffusion region 9 is provided in the vicinity of the portion connected to the lower electrode 8 in the photoelectric conversion part 3, the charge photoelectric-converted by the photoelectric conversion part 3 does not flow into the lower electrode 8 while the first insulating film 5 accumulates the charge, and noise can be reduced.

Application Example of Technology According to Present Disclosure

The technology according to the present disclosure can be applied to various products. Hereinafter, a more specific application example will be described. For example, the technology according to the present disclosure may be realized as a distance measuring device mounted on any type of mobile body such as an automobile, an electric vehicle, a hybrid electric vehicle, a motorcycle, a bicycle, a personal mobility, an airplane, a drone, a ship, a robot, a construction machine, and an agricultural machine (tractor).

[Mobile Body]

Figure 20:
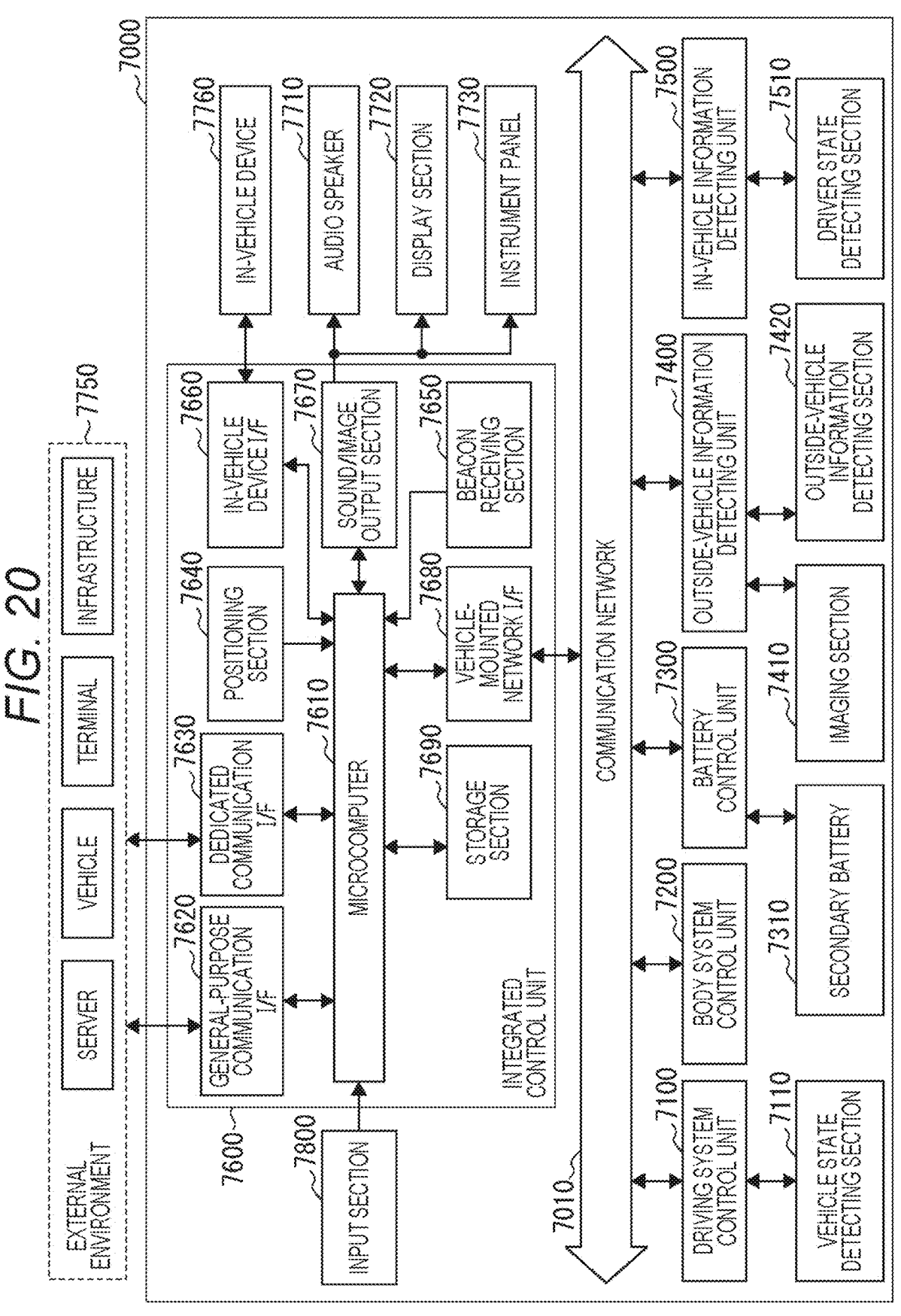
FIG. 20 is a block diagram illustrating a schematic configuration example of a vehicle control system which is an example of a mobile body control system to which the technology according to the present disclosure can be applied.

FIG. 20 is a block diagram illustrating a schematic configuration example of a vehicle control system 7000 which is an example of a mobile body control system to which the technology according to the present disclosure can be applied. The vehicle control system 7000 includes a plurality of electronic control units connected to each other via a communication network 7010. In the example depicted in FIG. 20, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 20 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 21:
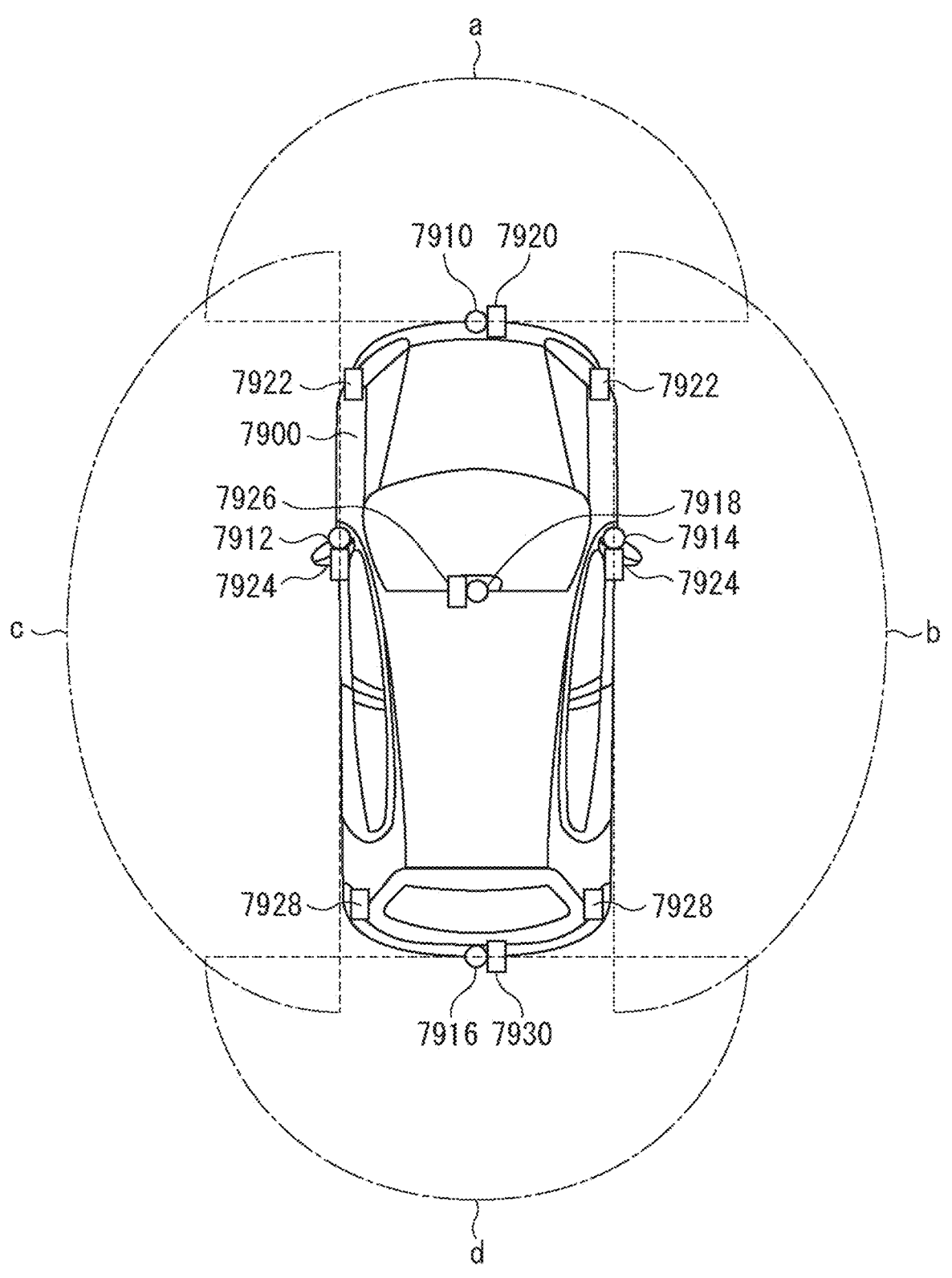
FIG. 21 is a view illustrating an example of an installation position of an imaging unit.

FIG. 21 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 20, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system of mobile communications (GSM (registered trademark)), worldwide interoperability for microwave access (WiMAX (registered trademark)), long term evolution (LTE (registered trademark)), LTE-Advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (WUSB). In addition, the in-vehicle device I/F 7660 may establish wired connection by universal serial bus (USB), high-definition multimedia interface (HDMI (registered trademark)), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automated driving, which makes the vehicle to travel automatedly without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 20, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 20 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

An example of the vehicle control system to which the technology according to the present disclosure can be applied has been described above. The technology according to the present disclosure can be applied to, for example, the imaging sections 7910, 7912, 7914, 7916, and 7918, the outside-vehicle information detecting sections 7920, 7922, 7924, 7926, 7928, and 7930, the driver state detecting section 7510, and the like, among the above-described configurations. Specifically, the solid-state imaging device 1 of the present disclosure can be applied to these imaging sections and detecting sections. Then, by applying the technology according to the present disclosure, the influence of a noise event such as sensor noise can be mitigated, and the occurrence of a true event can be reliably and quickly sensed, so that safe vehicle traveling can be realized.

Note that, the present technology can also adopt the following configurations.

A solid-state imaging device including a first substrate that performs photoelectric conversion and a second substrate that reads photoelectric-converted photocurrent, the first substrate and the second substrate being stacked, in which the first substrate includes:
a photoelectric conversion part;
a first insulating film that is disposed closer to the second substrate than the photoelectric conversion part and accumulates and transfers charge photoelectric-converted by the photoelectric conversion part;
a first electrode disposed closer to the second substrate than the first insulating film and disposed facing the photoelectric conversion part;
a second electrode disposed closer to the second substrate than the first insulating film and disposed apart from the first electrode; and
an impurity ion diffusion region disposed facing the second electrode and disposed in a depth direction of the photoelectric conversion part from an interface between the photoelectric conversion part and the first insulating film.
(2) The solid-state imaging device according to (1),
in which the impurity ion diffusion region is disposed in the photoelectric conversion part facing a region including an entire projected area obtained by projecting the second electrode on a surface of the photoelectric conversion part.
(3) The solid-state imaging device according to (1) or (2), further including a semiconductor layer disposed between the impurity ion diffusion region and the first insulating film and having a wider band gap than the impurity ion diffusion region.

(4) The solid-state imaging device according to any one of (1) to (3),
in which the first substrate further includes:
a plurality of pixels each including the photoelectric conversion part; and
a third electrode disposed closer to the second substrate than the first insulating film and along a boundary between the pixels, the third electrode being set to a fixed potential, and
at least a part of the impurity ion diffusion region is arranged in a region facing the third electrode in the photoelectric conversion part.
(5) The solid-state imaging device according to (4),
in which the impurity ion diffusion region is disposed in the photoelectric conversion part facing a region including an entire projected area obtained by projecting the third electrode on a surface of the photoelectric conversion part.
(6) The solid-state imaging device according to (4) or (5),
in which the impurity ion diffusion region includes:
a first diffusion region disposed in a region facing the second electrode in the photoelectric conversion part; and
a second diffusion region disposed in a region facing the third electrode in the photoelectric conversion part, and
the first diffusion region and the second diffusion region are arranged to be in contact with each other.
(7) The solid-state imaging device according to (4) or (5),
in which the impurity ion diffusion region includes:
a first diffusion region disposed in a region facing the second electrode in the photoelectric conversion part; and
a second diffusion region disposed in a region facing the third electrode in the photoelectric conversion part, and
the first diffusion region and the second diffusion region are arranged apart from each other.
(8) The solid-state imaging device according to any one of (4) to (7),
in which the first substrate has a contact electrically connected to the impurity ion diffusion region for each of the pixels, and
the impurity ion diffusion region is set to a predetermined potential by a voltage applied to the contact.
(9) The solid-state imaging device according to any one of (1) to (7), further including a contact disposed outside an effective pixel region in which the photoelectric conversion part is disposed and electrically connected to the impurity ion diffusion region,
in which the impurity ion diffusion region is set to a predetermined potential by a voltage applied to the contact.
(10) The solid-state imaging device according to any one of (1) to (9),
in which the impurity ion diffusion region is a region in which impurity ions having a polarity opposite to a polarity of a charge accumulated and transferred by the first insulating film are diffused.
(11) The solid-state imaging device according to any one of (1) to (10), further including a second insulating film provided between the first insulating film and the first electrode and containing a material different from a material of the first insulating film.
(12) The solid-state imaging device according to any one of (1) to (11), further including a columnar body disposed in a depth direction of the photoelectric conversion part from the interface between the photoelectric conversion part and the first insulating film, in which the impurity ion diffusion region is disposed along a surface of the columnar body.

(13) The solid-state imaging device according to any one of (1) to (12), in which the first substrate further includes a fourth electrode disposed on a side opposite to the first electrode with the photoelectric conversion part interposed between the first electrode and the fourth electrode, and the impurity ion diffusion region is disposed in contact with the fourth electrode.

(14) The solid-state imaging device according to any one of (1) to (13), in which the impurity ion diffusion region has a first diffusion region and a second diffusion region that are different in depth from the interface between the photoelectric conversion part and the first insulating film, and are arranged adjacent to each other.

(15) The solid-state imaging device according to (14), in which the first diffusion region is in contact with a surface of the photoelectric conversion part on a side opposite to the interface, and the second diffusion region is disposed up to a depth position shallower than a surface on the opposite side of the photoelectric conversion part.

(16) The solid-state imaging device according to any one of (1) to (15), in which the impurity ion diffusion region is diffused from the interface between the photoelectric conversion part and the first insulating film in a curved surface shape in a depth direction of the photoelectric conversion part.

(17) The solid-state imaging device according to any one of (1) to (16), in which the first insulating film is set to different potentials in a case of accumulating the photoelectric-converted charge from the photoelectric conversion part and in a case of transferring the accumulated charge to the second electrode.

(18) The solid-state imaging device according to any one of (1) to (17), in which the photoelectric conversion part is an organic photoelectric conversion part containing a plurality of types of organic materials having different polarities, the first substrate further includes:

an inorganic photoelectric conversion part that is disposed on a side opposite to the photoelectric conversion part with the first electrode and the second electrode interposed between the photoelectric conversion part and the inorganic photoelectric conversion part and contains a plurality of inorganic materials having different polarities, the inorganic photoelectric conversion part photoelectric-converts light in a plurality of optical wavelength ranges separately, and an optical wavelength range photoelectric-converted by the organic photoelectric conversion part is different from an optical wavelength range photoelectric-converted by the inorganic photoelectric conversion part.

(19) A method for manufacturing a solid-state imaging device, the method including the steps of:

forming an impurity ion diffusion region by implanting and diffusing impurity ions into a photoelectric conversion part in a first substrate;

forming a first insulating film on the first substrate so as to be in contact with the photoelectric conversion part and the impurity ion diffusion region;

forming a first electrode on the first insulating film so as to face the photoelectric conversion part, and forming a second electrode so as to correspond to the impurity ion diffusion region;

forming a wiring layer connected to the first electrode and the second electrode;

connecting a wiring layer of a second substrate to the wiring layer of the first substrate;

thinning the first substrate by cutting a surface side of the first substrate opposite to the wiring layer; and forming a third electrode on a cut surface of the first substrate.

(20) The method for manufacturing the solid-state imaging device according to (19), in which the step of forming the impurity ion diffusion region includes forming a trench in a depth direction from a surface of the photoelectric conversion part, and implanting impurity ions into the formed trench to form the impurity ion diffusion region.

Aspects of the present disclosure are not limited to the above-described embodiments, but include various modifications that can be conceived by a person skilled in the art, and the effects of the present disclosure are not limited to the above-described contents. That is, various additions, modifications, and partial deletions can be made without departing from the conceptual idea and gist of the present disclosure derived from the contents defined in the claims and equivalents thereof.

REFERENCE SIGNS LIST

1 Solid-state imaging device
2 First substrate
3 Photoelectric conversion part
4 Upper electrode
5 First insulating film
6 Second insulating film
7 Storage electrode
8 Lower electrode
9 Impurity ion diffusion region
11 Shield electrode
13a, 13b Wiring layer
14 Semiconductor layer
15 Trench
16 Columnar body
17 Contact
21 InP substrate
22 InGaAs layer
23 P+InP layer
24 i (or N)—InGaAs layer
25 Hard mask
31 Organic photoelectric conversion part
32R, 32B Inorganic photoelectric conversion part
33 Semiconductor substrate
34 Fixed charge layer
35 Dielectric layer
36 Interlayer insulating layer
37 Barrier adjustment electrode
38a, 38b, 38c Contact
39a, 39b, 39c Pad
40 Through electrode
41 Connecting portion
42 Contact
43a Reset gate
43b Channel formation region
43c, 43d Source/drain region
44a Gate

25

44*b* Channel formation region
44*c*, 44*d* Source/drain region
45 Lower first contact
46*a* Gate
46*b* Channel formation region
46*c*, 46*d* Source/drain region
The invention claimed is:

1. A solid-state imaging device, comprising:
a first substrate configured to execute photoelectric conversion; and
a second substrate configured to read photoelectric-converted photocurrent based on the execution of the photoelectric conversion, wherein
the first substrate and the second substrate are stacked, and
the first substrate includes:
a photoelectric conversion part;
a first insulating film that is closer to the second substrate than the photoelectric conversion part, wherein the first insulating film is configured to: accumulate a charge that is photoelectric-converted by the photoelectric conversion part, and transfer the accumulated charge;
a first electrode that is closer to the second substrate than the first insulating film and faces the photoelectric conversion part;
a second electrode that is closer to the second substrate than the first insulating film and is apart from the first electrode; and
an impurity ion diffusion region that faces the second electrode and is in a depth direction of the photoelectric conversion part from an interface between the photoelectric conversion part and the first insulating film.

2. The solid-state imaging device according to claim 1, wherein
the impurity ion diffusion region is in the photoelectric conversion part,
the impurity ion diffusion region faces a region including a projected area, and
the projected area is obtained based on projection of the second electrode on a surface of the photoelectric conversion part.

3. The solid-state imaging device according to claim 1, further comprising a semiconductor layer between the impurity ion diffusion region and the first insulating film, wherein the semiconductor layer has a wider band gap than the impurity ion diffusion region.

4. The solid-state imaging device according to claim 1, wherein the first substrate further includes:
a plurality of pixels, wherein each pixel of the plurality of pixels includes the photoelectric conversion part; and
a third electrode that is closer to the second substrate than the first insulating film, wherein
the third electrode is along a boundary between pixels of the plurality of pixels,
the third electrode is set to a fixed potential, and
at least a part of the impurity ion diffusion region is in a region that faces the third electrode in the photoelectric conversion part.

5. The solid-state imaging device according to claim 4, wherein
the impurity ion diffusion region is in the photoelectric conversion part,
the impurity ion diffusion region faces a region including a projected area, and

the projected area is obtained based on projection of the third electrode on a surface of the photoelectric conversion part.

6. The solid-state imaging device according to claim 4, wherein
the impurity ion diffusion region includes:
a first diffusion region in a region that faces the second electrode in the photoelectric conversion part; and
a second diffusion region in a region that faces the third electrode in the photoelectric conversion part, and
the first diffusion region is in contact with the second diffusion region.

7. The solid-state imaging device according to claim 4, wherein
the impurity ion diffusion region includes:
a first diffusion region in a region that faces the second electrode in the photoelectric conversion part; and
a second diffusion region in a region that faces the third electrode in the photoelectric conversion part, and
the first diffusion region is apart from the second diffusion region.

8. The solid-state imaging device according to claim 4, wherein
the first substrate has a contact electrically connected to the impurity ion diffusion region for the each pixel of the plurality of pixels, and
the impurity ion diffusion region is set to a specific potential by a voltage applied to the contact.

9. The solid-state imaging device according to claim 1, further comprising a contact outside an effective pixel region in which the photoelectric conversion part is present, wherein
the contact is electrically connected to the impurity ion diffusion region, and
the impurity ion diffusion region is set to a specific potential by a voltage applied to the contact.

10. The solid-state imaging device according to claim 1, wherein the impurity ion diffusion region is a region in which impurity ions having a polarity opposite to a polarity of the charge accumulated and transferred by the first insulating film are diffused.

11. The solid-state imaging device according to claim 1, further comprising a second insulating film between the first insulating film and the first electrode, wherein the second insulating film contains a material different from a material of the first insulating film.

12. The solid-state imaging device according to claim 1, further comprising a columnar body in the depth direction of the photoelectric conversion part from the interface between the photoelectric conversion part and the first insulating film,
wherein the impurity ion diffusion region is along a surface of the columnar body.

13. The solid-state imaging device according to claim 1, wherein
the first substrate further includes a third electrode on a side opposite to the first electrode with the photoelectric conversion part between the first electrode and the third electrode, and
the impurity ion diffusion region is in contact with the third electrode.

14. The solid-state imaging device according to claim 1, wherein
the impurity ion diffusion region has a first diffusion region and a second diffusion region, a depth of the first diffusion region is different from a depth of the second diffusion region from the interface between the photoelectric conversion part and the first insulating film, and the first diffusion region is adjacent to the second diffusion region.

15. The solid-state imaging device according to claim 14, wherein the first diffusion region is in contact with a surface of the photoelectric conversion part on an opposite side to the interface, and the second diffusion region is up to a depth position shallower than the surface on the opposite side of the photoelectric conversion part.

16. The solid-state imaging device according to claim 1, wherein the impurity ion diffusion region is diffused from the interface between the photoelectric conversion part and the first insulating film in a curved surface shape in the depth direction of the photoelectric conversion part.

17. The solid-state imaging device according to claim 1, wherein a potential of the first insulating film in a case of the accumulation of the photoelectric-converted charge from the photoelectric conversion part is different from a potential of the first insulation film in a case of transfer of the accumulated charge to the second electrode.

* * * * *